US008629436B2

(12) United States Patent
Prabhakar

(10) Patent No.: US 8,629,436 B2
(45) Date of Patent: Jan. 14, 2014

(54) BACKSIDE ONLY CONTACT THIN-FILM SOLAR CELLS AND DEVICES, SYSTEMS AND METHODS OF FABRICATING SAME, AND PRODUCTS PRODUCED BY PROCESSES THEREOF

(75) Inventor: Venkatraman Prabhakar, Pleasanton, CA (US)

(73) Assignee: Gigasi Solar, Inc., Pleasanton, CA (US)

( * ) Notice: Subject to any disclaimer, the term of this patent is extended or adjusted under 35 U.S.C. 154(b) by 66 days.

(21) Appl. No.: 12/857,549

(22) Filed: Aug. 16, 2010

(65) Prior Publication Data

US 2011/0089420 A1    Apr. 21, 2011

Related U.S. Application Data

(60) Provisional application No. 61/274,259, filed on Aug. 14, 2009.

(51) Int. Cl.
*H01L 31/0248* (2006.01)

(52) U.S. Cl.
USPC ........................................................ 257/53

(58) Field of Classification Search
USPC .................................. 257/53, 72, 54, 55, 59
See application file for complete search history.

(56) References Cited

U.S. PATENT DOCUMENTS

| 4,309,225 A | 1/1982 | Fan et al. |
| 4,927,770 A | 5/1990 | Swanson |
| 4,933,022 A | 6/1990 | Swanson |
| 5,053,083 A | 10/1991 | Sinton |
| 5,374,564 A | 12/1994 | Bruel |
| 5,466,638 A | 11/1995 | Eguchi |
| 6,020,252 A | 2/2000 | Aspar et al. |
| 6,222,209 B1 * | 4/2001 | Antich et al. ................. 257/186 |
| 6,241,817 B1 | 6/2001 | Jang et al. |
| 6,372,609 B1 | 4/2002 | Aga et al. |
| 6,620,645 B2 | 9/2003 | Chandra et al. |

(Continued)

FOREIGN PATENT DOCUMENTS

| DE | 1020070084540 A1 | 8/2008 |
| JP | 2005-175399 | 6/2005 |

(Continued)

OTHER PUBLICATIONS

Crowder et al., Low-Temperature Single-Crystal Si TFT's Fabricated on Si Films Processed via Sequential Lateral Solidification, IEEE Electron Device Letters, Aug. 1998, pp. 306-308, vol. 19, No. 8, IEEE, USA.

(Continued)

*Primary Examiner* — Nathan Ha
(74) *Attorney, Agent, or Firm* — DLA Piper LP (US)

(57) ABSTRACT

Systems, methods, devices, and products of processes consistent with the innovations herein relate to thin-film solar cells having contacts on the backside, only. In one exemplary implementation, there is provided a thin film device. Moreover, such device may comprise a substrate, and a layer of silicon or silicon-containing material positioned on a first side of the substrate, wherein the layer comprises a n-doped region and a p-doped region. In some exemplary implementations, the device may be fabricated such that the n-doped region and the p-doped region are formed on the backside surface of the layer to create an electrical structure characterized by a P-type anode and an N-type cathode forming a junction positioned along the backside surface of the layer.

19 Claims, 18 Drawing Sheets

(56) References Cited

U.S. PATENT DOCUMENTS

| | | | |
|---|---|---|---|
| 6,927,417 B2* | 8/2005 | Nagashima et al. | 257/55 |
| 7,119,365 B2 | 10/2006 | Takafuji et al. | |
| 7,396,744 B2 | 7/2008 | Son et al. | |
| 7,826,700 B2* | 11/2010 | Knights et al. | 385/40 |
| 7,863,611 B2* | 1/2011 | Abe et al. | 257/58 |
| 7,897,471 B2* | 3/2011 | Hao | 438/288 |
| 8,008,726 B2* | 8/2011 | Jou et al. | 257/360 |
| 2001/0038096 A1* | 11/2001 | Fukushima et al. | 257/53 |
| 2002/0050593 A1* | 5/2002 | Fukunaga et al. | 257/53 |
| 2002/0160553 A1 | 10/2002 | Yamanaka et al. | |
| 2003/0183876 A1 | 10/2003 | Takafuji et al. | |
| 2004/0056332 A1 | 3/2004 | Bachrach et al. | |
| 2004/0217423 A1 | 11/2004 | Park et al. | |
| 2004/0241960 A1 | 12/2004 | Maurice et al. | |
| 2004/0255845 A1 | 12/2004 | Voutsas et al. | |
| 2005/0172888 A1 | 8/2005 | Gosain | |
| 2006/0121691 A1 | 6/2006 | Noguchi et al. | |
| 2007/0032040 A1 | 2/2007 | Lederer | |
| 2007/0054466 A1 | 3/2007 | Hebras | |
| 2007/0125421 A1* | 6/2007 | Park et al. | 136/263 |
| 2008/0017243 A1 | 1/2008 | DeCeuster et al. | |
| 2008/0121264 A1* | 5/2008 | Chen et al. | 136/244 |
| 2008/0188011 A1 | 8/2008 | Henley | |
| 2008/0196761 A1* | 8/2008 | Nakano et al. | 136/258 |
| 2008/0251126 A1 | 10/2008 | Yamazaki et al. | |
| 2008/0295885 A1 | 12/2008 | Lee | |
| 2008/0308143 A1* | 12/2008 | Atanackovic | 136/255 |
| 2009/0120924 A1 | 5/2009 | Moffatt et al. | |
| 2009/0255572 A1* | 10/2009 | Oswald | 136/251 |
| 2009/0255585 A1* | 10/2009 | Shaikh et al. | 136/261 |
| 2009/0321884 A1 | 12/2009 | Faure et al. | |
| 2010/0248413 A1* | 9/2010 | Strand et al. | 438/67 |
| 2010/0304151 A1 | 12/2010 | Tuennermann et al. | |
| 2011/0089420 A1 | 4/2011 | Prabhakar | |
| 2011/0214708 A1* | 9/2011 | Yago | 136/244 |
| 2011/0306180 A1 | 12/2011 | Prabhakar | |
| 2011/0318941 A1* | 12/2011 | Schmidt et al. | 438/778 |
| 2012/0012166 A1* | 1/2012 | Atanackovic | 136/252 |
| 2012/0018733 A1 | 1/2012 | Prabhakar | |

FOREIGN PATENT DOCUMENTS

| | | |
|---|---|---|
| KR | 10-2003-0077410 A | 10/2003 |
| KR | 10-2004-0093949 A | 11/2004 |
| KR | 10-2007-0067394 A | 6/2007 |
| WO | WO 2008/039078 | 4/2008 |

OTHER PUBLICATIONS

Tamagawa et al., Green Laser Annealing System for Manufacturing LTPS TFTs, ULVAC Technical Journal (English), 2006, pp. 32-36, No. 64E, ULVAC. *The month of publication is unavailable, but the year of publication is sufficiently earlier than the effective U.S. filed and any foreign priority date so that the particular month of publication in not an issue. MPEP 609.04(a) (1).*

Izmajlowicz et al., Directional Nickel-induced Fielded Aided Lateral Crystallization of Amorphous Silicon, Journal of Applied Physics, Dec. 15, 2003, pp. 7535-41, vol. 94, No. 12, American Institute of Physics, USA.

Buh et al., Integration of Sub-melt Laser Annealing on Metal Gate CMOS Devices for Sub 50 nm Node DRAM, Electron Devices Meeting, IEDM International 2006, San Francisco, CA, Dec. 11-13, 2006, pp. 1-4.

Carlson, Amorphous Silicon Solar Cells, IEEE Transactions on Electron Devices, Apr. 1977, pp. 449-453, vol. ED-24, No. 4, IEEE, USA.

Sinton, Simplified Backside-Contact Solar Cells, IEEE Transactions on Electron Devices, Feb. 1990, pp. 348-352, vol. 37, No. 2, IEEE, USA.

Rao et al., Investigations of LPCVD-ZnO Front Contact TCO on Large Area for Amorphous Silicon Solar Cell Applications, Photovoltaic Specialists Conference 2008, San Diego, CA, May 11-16, 2008, pp. 1-4.

McCann, Michelle, Catchpole, Kylie, and Blakers, Andrew W., A Review of Thin Film Silicon for Solar Cells Applications, published online by ANU Research 2004 (see http://hdl.handle.net/1885/40839), pp. 1-23.

Park, et al., Integration of Single-Crystal LiNbO3 Thin Film on Silicon by Laser Irradiation and Ion-Implantation-Induced Layer Transfer, Advanced Materials, 2006, 18, pp. 1533-1536.

International Search Report and Written Opinion dated Feb. 28, 2011, in PCT Application No. PCT/US2010/043164.

International Search Report and Written Opinion dated Mar. 28, 2011, in PCT Application No. PCT/US2010/043600.

U.S. Appl. No. 13/160,476, filed Jun. 2011, Prabhakar.

U.S. Appl. No. 13/190,457, filed Jul. 2011, Prabhakar.

International Preliminary Report on Patentability dated Feb. 2, 2012, in counterpart PCT Application No. PCT/US2010/043164.

International Preliminary Report on Patentability dated Feb. 9, 2012, in counterpart PCT Application No. PCT/US2010/043600.

International Search Report dated May 26, 2011, in counterpart PCT Application No. PCT/US2010/045672.

International Search Report dated Feb. 29, 2012, in counterpart PCT Application No. PCT/US2011/040404.

Park, et al., Line Bonding of Wafers Using Transmission Laser Bonding Technique for Microsystem Packaging, IEEE (2006), pp. 1358-1364.

Park et al., Transmission Laser Bonding of Glass With Silicon Wafer, Proceedings of 2004 JUSFA (2004), pp. 1-7.

Tseng, et al., Using Transmission Laser Bonding Technique for Line Bonding in Microsystems Packaging,: IEEE Transactions on Electronics Packaging Manufacturing, Oct. 2006, vol. 29, No. 4, pp. 308-318.

Tseng, et al., Mechanical Strength and Interface Characteristics of Transmission Laser Bonding, IEEE 29, 3 (2006), pp. 191-201.

Tseng et al., Effects of Surface Roughness and Contact Pressure on Wafer Bonding Strength Using Transmission Laser Bonding Technique, J. Microlith., Microfab., Microsyst. 5,4 (2006), pp. 1-11.

* cited by examiner

BACKSIDE ONLY CONTACT THIN-FILM SOLAR CELLS AND DEVICES, SYSTEMS AND METHODS OF FABRICATING SAME, AND PRODUCTS PRODUCED BY PROCESSES THEREOF

CROSS-REFERENCE TO RELATED APPLICATION(S)

This application claims benefit and priority of U.S. provisional patent application No. 61/274,259, filed Aug. 14, 2009, which is incorporated herein by reference in entirety.

BACKGROUND

1. Field

The present innovations relate to solar cells, and, more particularly, to thin-film solar cells having contacts on the backside, only.

2. Description of Related Information

Solar cells may be characterized by their electrical contacts, such as those with electrical contacts on both the front side and backside of crystalline silicon solar cells. With regard to solar cells, the front is generally considered to be the side from which the sunlight enters the device. In existing devices, the n-doped region (cathode) and p-doped region (anode) are arranged in a vertical manner, front side to backside, and separated by a lightly doped region.

In addition to other drawbacks, solar cells with front-side contacts suffer from "shadowing", i.e., shadows caused by front side structures that diminish the sunlight that reaches the solar cell to be transformed into electricity. To avoid this problem, existing solar cell fabrication methods sometimes use transparent conductive oxides (TCOs) for front-side contacts. One such transparent conductive oxide is ITO (Indium-Tin-Oxide). Notably, the use of these transparent electrodes involves a trade-off between electrical and optical performance, i.e., a thicker layer will have lower resistance and hence a higher electrical efficiency. However, a thicker layer will also transmit less light into the solar cell and hence create lower optical efficiency. Furthermore, TCO/ITO layers are also very sensitive to moisture an contribute to the degradation of solar cell efficiency and reliability over their 20-30 year lifetime. In addition, backside contact solar cells generally require high quality device layers (e.g. silicon) which have not yet been possible given existing technologies.

With regard to solar cells consisting of crystalline silicon, most devices are formed with front and backside contacts. However, some limited technologies for such full-silicon substrates do utilize contacts on the backside, only. One drawback of these technologies is that they generally require high temperature anneal processes (e.g. 900° C.) to passivate the backside and also to diffuse the dopants into the silicon substrate. Such high temperatures are above the softening point of glass and cannot be used with thin film technologies that utilize glass and plastic substrates. In addition, the purely silicon substrates require a thickness of more than 150 or 200 µm for mechanical stability. This increases the material costs substantially as well as the processing/manufacturing costs, e.g., due to the need for high temperature steps, etc.

As set forth below, one or more exemplary aspects of the present inventions may overcome such drawbacks and/or otherwise impart innovations consistent with the systems and methods herein via the provision of backside only contact thin-film solar cells and/or devices.

SUMMARY

Systems, methods, devices, and products of processes consistent with the innovations herein relate to thin-film solar cells having contacts on the backside, only.

In one exemplary implementation, there is provided a thin film device. Moreover, such device may comprise a substrate, and a layer of silicon or silicon-containing material positioned on a first side of the substrate, wherein the layer comprises a n-doped region and a p-doped region. In some exemplary implementations, the device may be fabricated such that the n-doped region and the p-doped region are formed on the backside surface of the layer to create an electrical (e.g., diode) structure characterized by a P-type anode and an N-type cathode forming junction(s) positioned along the backside surface of the layer.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed inventions. Instead, they are merely some examples consistent with certain aspects related to the innovations herein. Wherever possible, the same reference numbers will be used throughout the drawings to refer to the same or like parts.

Systems, methods, devices, and products by processes associated with thin-film solar cells having contacts on the backside, only, are disclosed. Consistent with aspects of the present innovations, such implementations may relate to thin film devices comprising a substrate and a layer of silicon or silicon-containing material positioned on a first side of the substrate, wherein the layer comprises one or more n-doped region(s) and one or more p-doped region(s). Moreover, the innovations herein may include n-doped region(s) and the p-doped region(s) formed on the backside surface of the layer to create an electrical structure characterized by a P-type anode and an N-type cathode forming junction(s) positioned along the backside surface of the layer. Other exemplary implementations may further comprise one or more first contacts placed on the layer above, and electrically connected to, the n-doped region(s), as well as one or more second contacts place on the layer above, and electrically connected to, the p-doped region(s).

With regard to exemplary solar cell (or device) implementations, innovative cell architectures for thin-film solar cells are provided. Again, these architectures have both contacts (positive and negative or P-type and N-type) on the backside of the solar cell. Further, while a type of backside-only contact architecture has been used in some full-thickness crystalline silicon solar cells, the present innovations relate to devices consistent with thin film solar cells using, e.g., amorphous/poly silicon, as set forth herein.

Figure 1A:
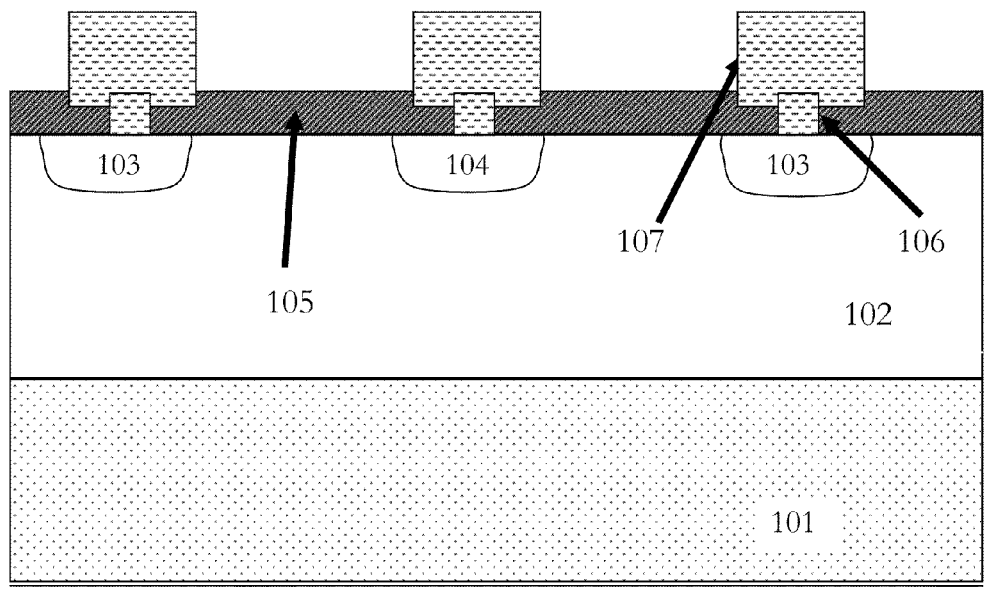
FIGS. 1A-1C illustrate several views of exemplary thin-film solar cell structures or devices, consistent with aspects related to the innovations herein.
Figure 1B:
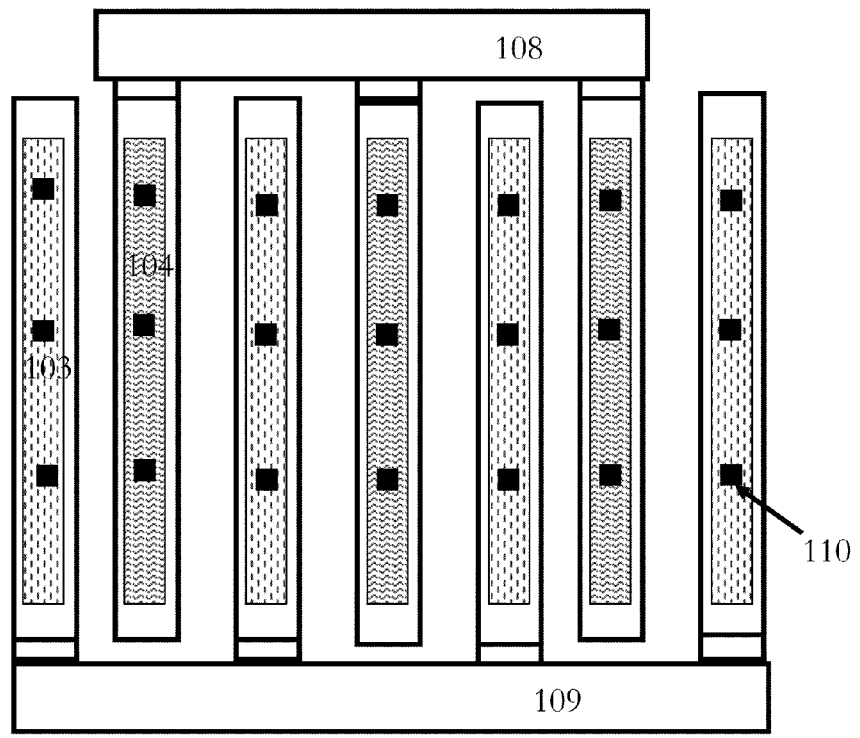
Figure 1C:
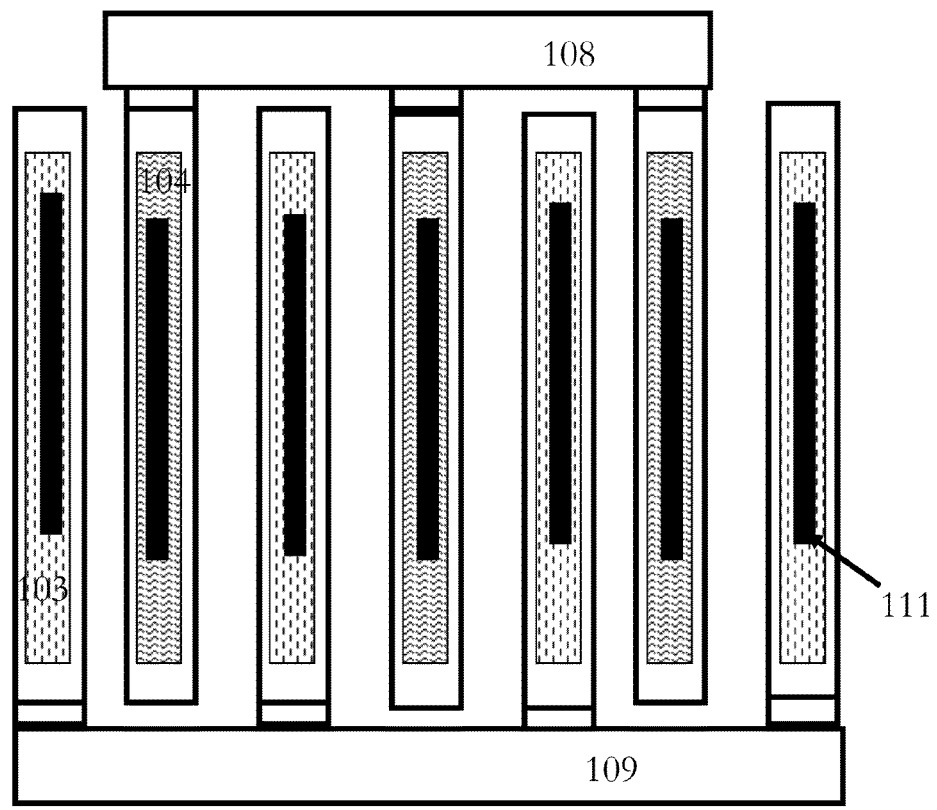

FIGS. 1A-1C illustrate several views of exemplary thin-film solar cell structures or devices, consistent with aspects related to the innovations herein. Referring to FIG. 1A, a cross-sectional view of an exemplary implementation of a solar cell structure is provided. Here, a substrate 101, such as a glass sheet, is positioned on the front side of the structure, where e.g. sunlight will initially enter the solar cell. According to some implementations, a silicon or silicon-containing layer 102 is positioned against the substrate 101, on a side away from the entering sunlight. In one exemplary implementation, a thin film silicon layer may be deposited as an amorphous film and then crystallized either using a laser or other anneal, as set forth in more detail below. However, in other implementations the innovations herein, films may simply be deposited in amorphous or poly/multi/nano crystalline form, without further processing such as laser anneal prior to doping/contact formation. For purpose of illustration, N+ regions 103 may first be defined and dopants such as arsenic or phosphorous are incorporated into these regions. In one approach, these atoms could be implanted into the silicon to form the N+ region(s) 103. Other approaches may include doping via solid state diffusion from dopant sources or diffusion from gas sources including diffusion activated via laser irradiation. In this illustrative example, P+ regions 104 may then be defined, wherein dopants such as boron and/or BF2 can be incorporated into these regions. The order of defining and doping the N+ and P+ regions is not critical and can be reversed depending on differing implementations of the present inventions. An insulating layer 105 may then be deposited or grown on the silicon layer. Further, in some implementations, this insulating layer could be comprised of multiple materials and layers. For example, in some implementations, a thin layer of oxide may be grown by plasma or other means and then a nitride layer may be deposited by a suitable means such as PECVD (plasma enhanced chemical vapor deposition). Finally, contact holes or slots 106 are cut into the insulating layer 105 and contacts 107 may be deposited and patterned to make connections to the solar cell.

Accordingly, consistent with the innovations herein, the n-doped and p-doped regions may be disposed laterally and all the electrical contacts are at the backside of the solar cell. Beneficial aspects of such innovations may include a simplified contacting scheme, since a single contacting layer such as a metal layer can be used to connect both the n-doped and p-doped regions. Further, innovations are achieved via the ease of electrically coupling the individual areas within a solar panel, without the difficulty of fabricating contacts to the front-side of the solar cells. Moreover, the innovations recited herein provide devices, methods, architectures and products-by-processes that are low cost without the efficiency losses found in existing systems and techniques.

FIG. 1B illustrates a top view layout of an exemplary thin-film solar cell structure or device, consistent with aspects related to the innovations herein. FIG. 1B depicts one exemplary implementation of the present innovations, wherein the doped regions 103, 104 are shown connected to upper contacts structure a discrete points 110, such as via holes that may be etched or otherwise cut through the insulating layer. Electrically conductive regions 108, 109, such as metal lines and/or plates are connected to the P+ and N+ regions. Here, FIG. 1B shows a parallel connection 109 of all the metal lines going to the N+ (cathode) regions 103 as well as another parallel connection 108 of all the metal lines going to the P+ (anode) regions 104. In should be noted, however, that in other implementations of the innovations herein, one or more combination(s) of series and parallel connections of the metal lines can be used to obtain the desired voltage and current from the solar cell. Additionally, the N+ regions 103 and P+ regions 104 are shown as alternating in this exemplary implementation. However, in other implementations, the N+ and P+ layers may be non-alternating. Moreover, in still other implementations, various further structures and arrangements may be used, such as two N+ regions with a P+ ring-shaped region surrounding them, to provide the desired currents/voltages. Again, in this example, point contacts 110 are shown for both the N+ and P+ regions.

FIG. 1C illustrates another top view layout of a further exemplary thin-film solar cell structure or device, consistent with aspects related to the innovations herein. The structures, doping and contacts of FIG. 1C are generally similar to those of FIG. 1B except that FIG. 1C illustrates an alternate backside contact solar cell implementation having "slot" contacts 111 instead of the point (square or round) contacts 110 as shown in FIG. 1B.

Figure 2:
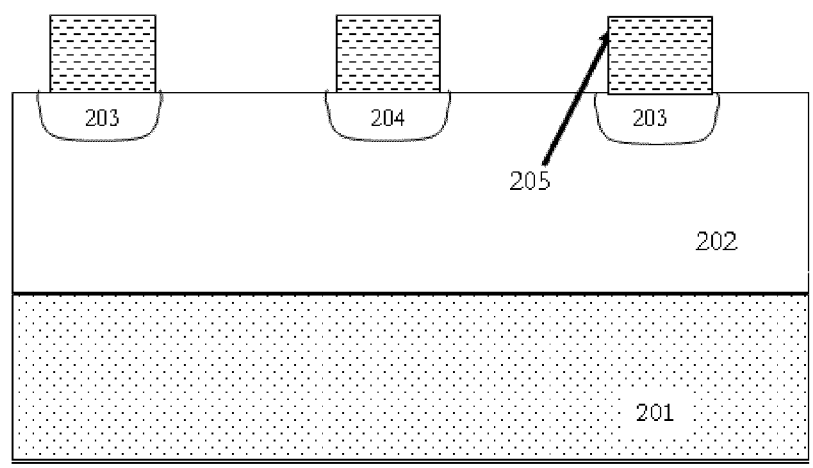
FIG. 2 illustrates another exemplary thin-film solar cell structure/device, consistent with aspects related to the innovations herein.

FIG. 2 illustrates another exemplary thin-film solar cell structure or device, consistent with aspects related to the innovations herein. Referring to FIG. 2, an alternative backside contact solar cell without an insulating layer 105 (FIG. 1A) is shown. While solar cells and devices with insulating layer(s) provide higher efficiencies, implementations consistent with FIG. 2 (without the insulating layer) are less costly to manufacture due to less complexity in the fabrication process and overall structural simplicity. In exemplary implementations consistent with FIG. 2, contacts 205 may be an electrically conductive layer, such as a metallization layer (singular) or layers (plural), which may be a metal such as silver (Ag) or Aluminum (Al), or even other metals, such as Nickel (Ni), Ti (Titanium), Cobalt (Co), and/or Palladium (Pd). In short, the contacts or metallization may be more than a single layer and/or more than a single metal. Here, for example, an initial layer of Nickel may be used to achieve good contact resistance, followed by Aluminum lines providing appropriate thickness for the metallization layer. Preferred embodiment is to screen print the metallization layer. However, other methods such as PVD (physical vapor deposition), CVD (chemical vapor deposition), evaporation can be used.

According to some implementations of the innovations herein, a layer such as an anti-reflective layer of SiN, SiO2 or SiON may be provided between the substrate 201 and the amorphous/poly layer 202. In exemplary implementations, the amorphous/poly layer 202 may be amorphous silicon. Further, in some implementations, the amorphous/poly layer or amorphous silicon may have reduced hydrogen content. Here, for example, the reduced hydrogen content may be achieved by adjustment of the deposition method, such as using different gases or gas ratios in the deposition chamber and/or by adding a post-deposition anneal to drive out the hydrogen. A laser may then be applied and scanned across the substrate, e.g., to transform the silicon into crystalline or partially crystalline form. It should be noted that the inventions herein are not limited to particular laser wavelengths or optics needed to create certain spot sizes and shapes, such as a line source or other shapes. Instead, the innovations herein encompass all such variations as long as the energy density crystallizes or partially crystallizes the amorphous/poly layer.

Figure 13:
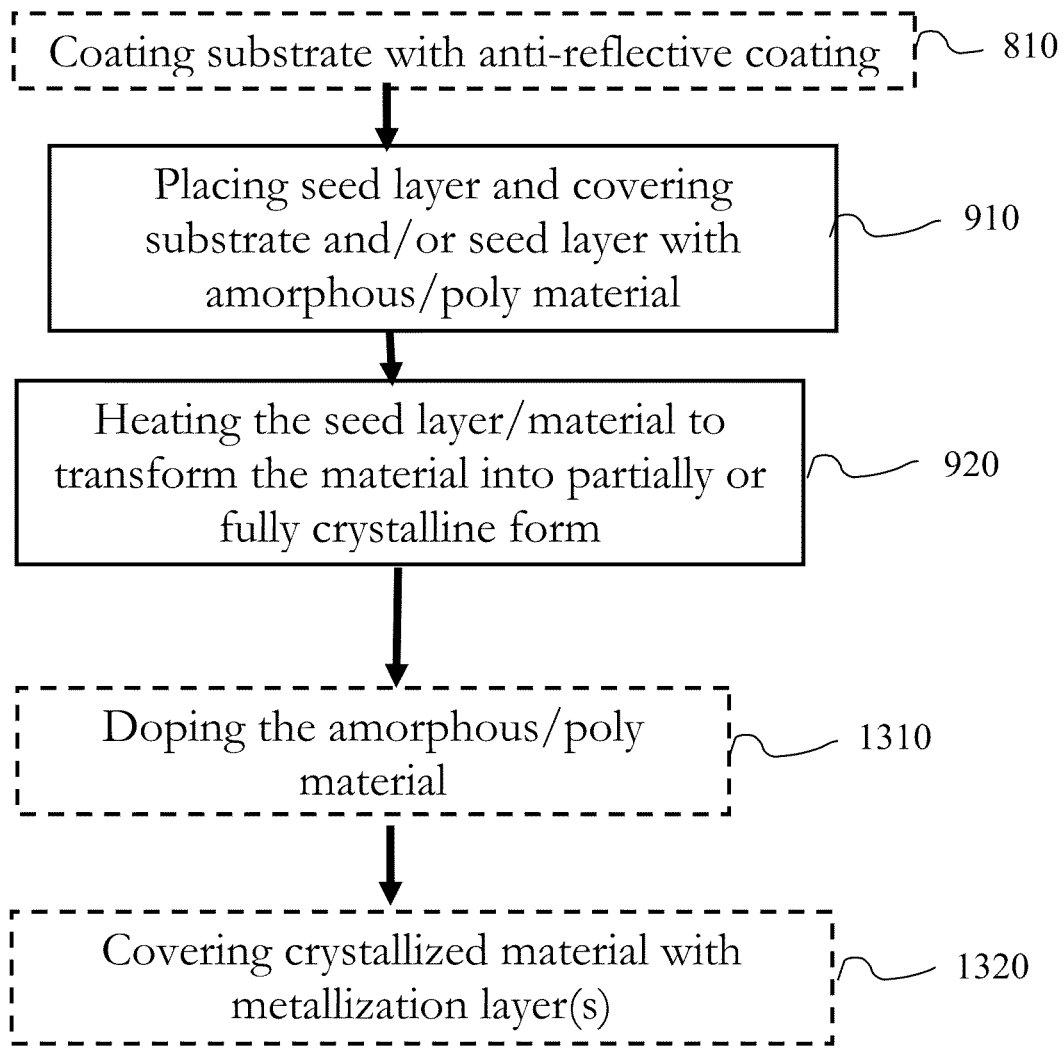
Figure 14:
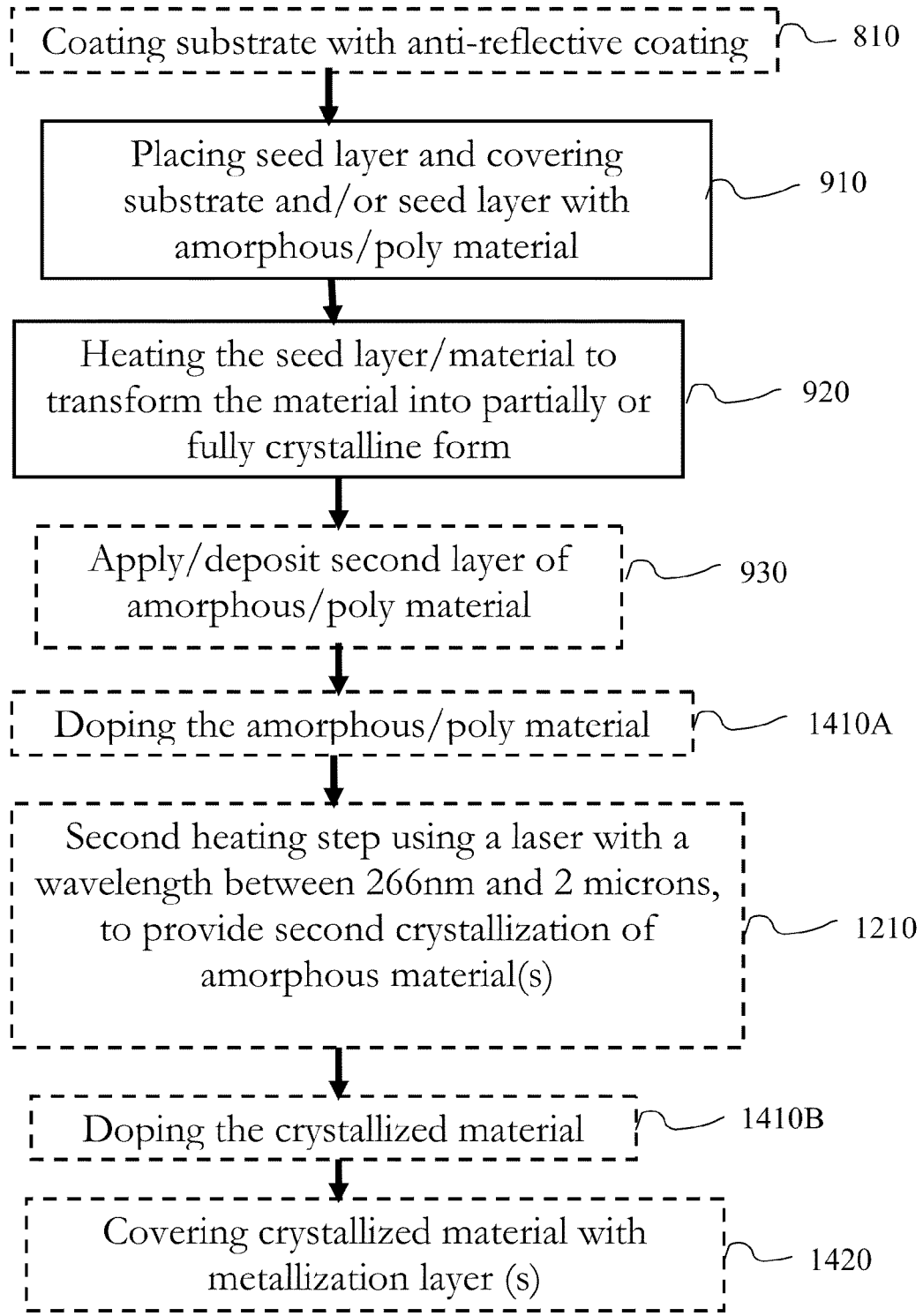

The present disclosure is initially directed to aspects associated with backside only contact thin film solar cells. Various other steps, products and processes consistent with the innovations set forth herein are also disclosed, as described in more detail beginning with FIG. 7A. These implementations, for example, may include bonding a seed layer of crystalline silicon which can be a wafer, or a part of a silicon wafer, on glass. Further, these implementations may also have another layer, for instance and anti-reflective coating, deposited before bonding the seed layer. The seed layer may also be affixed to the glass sheet by methods other than silicon bonding, such as with a glue layer. Alternative implementations include placing the silicon layer on the substrate using mechanical means such as mechanical pressure, vacuum etc. Detail of these, and other, exemplary implementations are set forth in connection with FIGS. 7A-12. Some applications consistent with the innovations herein include solar cells (FIGS. 13-15). However, the innovations herein are not limited to just such exemplary applications, but can be used for other applications as well.

Some of the disclosure herein uses the terms 'amorphous layers' or 'amorphous silicon', such as when describing crystallization of such layers using a silicon seed layer. However, the innovations herein are not limited to just amorphous layer(s), i.e., such layer could be poly crystalline or multi-crystalline. In addition, the amorphous/poly layer could contain substantial or even majority quantities of other materials including but not limited to Germanium (Ge), Carbon (C), Fluorine (F) etc. According to other implementations, the amorphous/poly material may be or include an amorphous/poly silicon layer that includes some Ge (to form SiGe) or C (to form SiC). The amorphous/poly material may be a silicon material that contains elements such as F (Fluorine), D (Deuterium), Hydrogen (H), Chlorine (Cl) etc., which may be useful in passivating the traps, grain boundaries, etc. in the crystallized silicon-containing film. The amorphous/poly material may also, in some implementations, include dopants such as B (Boron), Phosphorous (P), Arsenic (As) etc. incorporated in the film. In further implementations, the substrate or support layer (e.g., glass, etc.) can be replaced by other substrates such as plastics and/or metals. Overall, aspects of such innovations may lead to uniform grains, high carrier lifetime(s), and/or improved diffusion length(s) and mobilities.

Turning back to the laser anneal aspects, the amorphous/poly layer 103 may then be crystallized via heat application such as laser irradiation. In some exemplary implementations, such irradiation may be performed by a solid state laser with a wavelength between about 266 nm and about 2 μm. In certain exemplary implementations, the laser may be a solid state laser with a wavelength of about 515 nm or about 532 nm. The laser may be applied from the top of the substrate. However, in other implementations described elsewhere herein, the laser can also be applied from the bottom (through the substrate 101), i.e., when the substrate is mostly transparent to the laser wavelength used/selected. The choice of the laser being used from the top or through substrate may depend on the type of substrate being used as well as the types of materials used in and thicknesses of the anti-reflective coating and the amorphous/poly material(s).

As discussed herein, aspects of the innovations herein may include coating layers either on the outside of the substrate/glass layer, or in between the glass and the silicon layer, or in both places. Examples of such coating layers may include additional anti-reflective coating on the outside (light facing) side of the glass layer and/or a SiN or SiON or SiO2 layer or combination of these between the glass and silicon layer. In addition, still further aspects of the innovations herein may include other methods of crystallization, such as heat sources such as carbon strips or lamps which can be used to supply the heat needed for crystallization Innovations herein are also applicable to other semiconductor materials such as SiGe (silicon-germanium) or SiC (silicon-carbide).

According to exemplary implementations of the innovations herein, a seed layer may be used and the seed layer may even be a silicon wafer or piece thereof. Further, consistent with some implementations, such piece of silicon wafer may applied with the desired thickness or it may be simultaneously or sequentially reduced in thickness by a suitable method such as cleaving, etching, polishing, etc., e.g., in one exemplary implementation, to a thickness of about 0.05 μm to about 100 μm. Here, such exemplary part of silicon wafer could be piece reduced in thickness by cleaving or thinning the wafer after bonding to leave only a thin layer on the glass.

Additional details of such thin film fabrication processing including substrates with seed layers, and related processing, may be found in U.S. patent application Ser. No. 12/842,996, filed Jul. 23, 2010, published as U.S. patent application publication No. 2011/0089429A1, and U.S. patent application Ser. No. 12/845,691, filed Jul. 28, 2010, published as U.S. patent application publication No. 2011/0101364A1, now U.S. Pat. No. 8,361,890 which are incorporated herein by reference in entirety. Further descriptions of the use of lasers to crystallize the amorphous/poly layer are set forth in more detail further below.

Figure 3A:
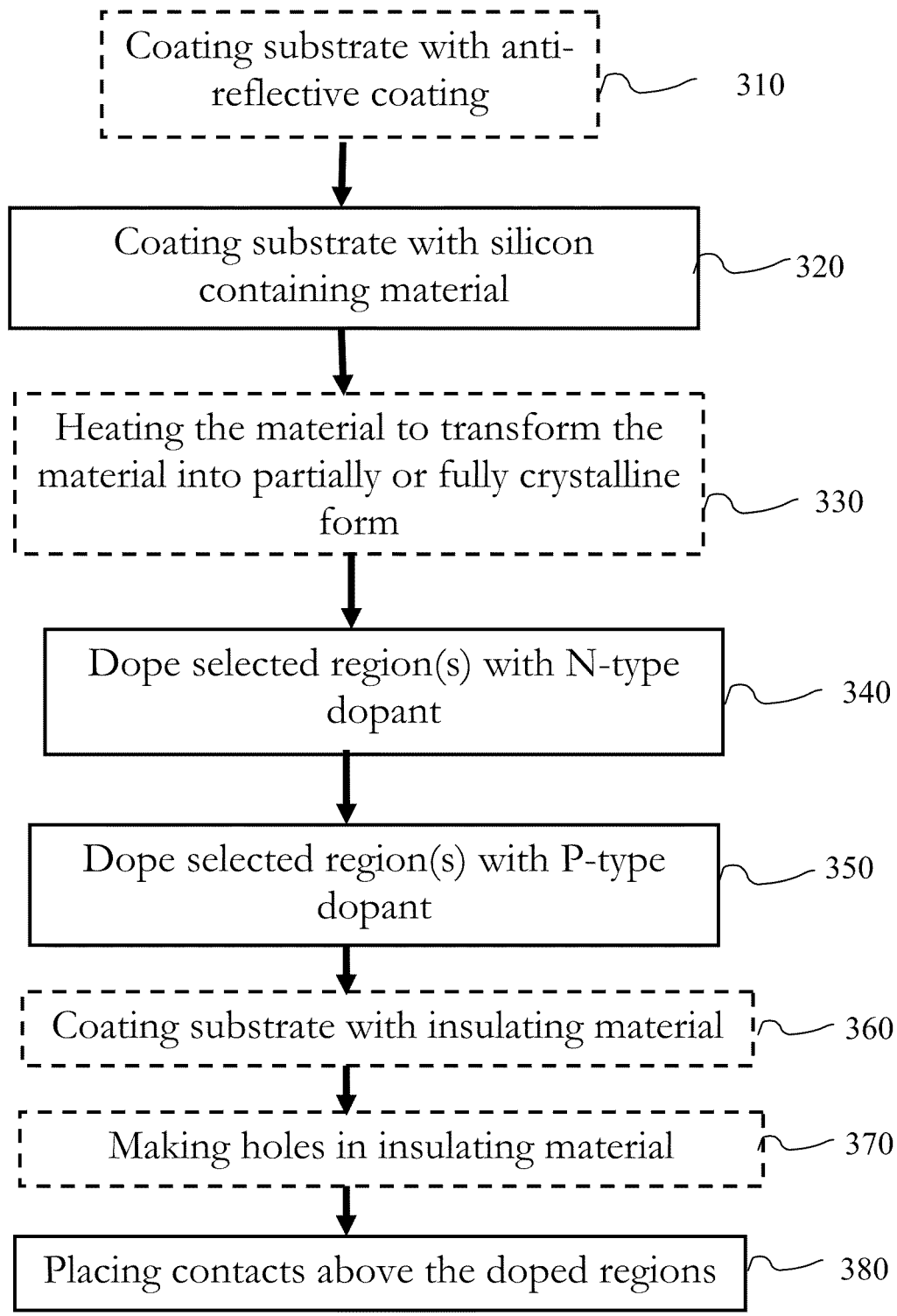
FIGS. 3A and 3B illustrate exemplary methods related to fabrication of thin-film substrates, consistent with aspects related to the innovations herein.
Figure 3B:
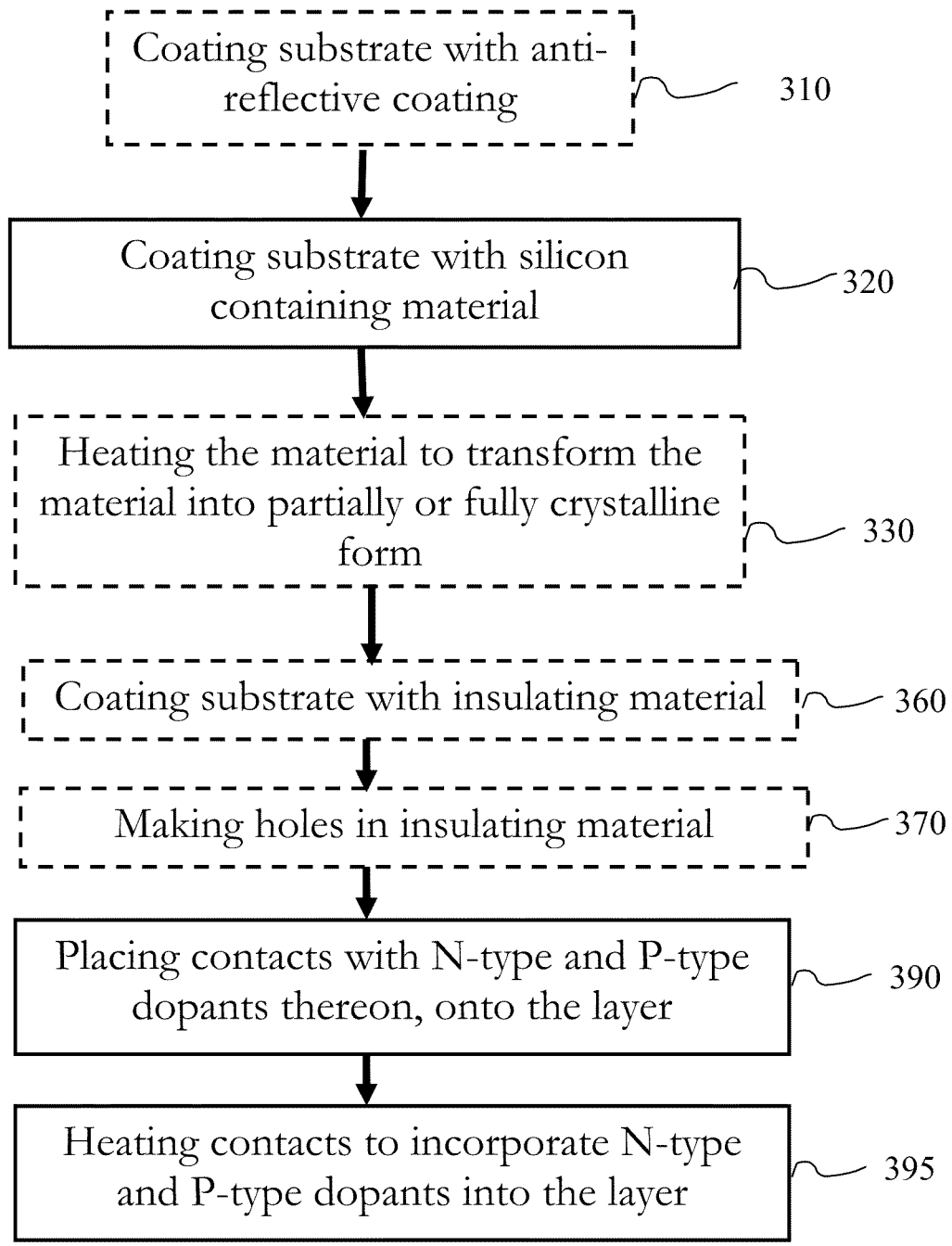

FIGS. 3A and 3B illustrate exemplary methods related to fabrication of thin-film substrates, consistent with aspects related to the innovations herein. Referring to FIG. 3A, an initial step of coating the substrate with amorphous/poly material may be performed (step 320). Here, a silicon layer or silicon containing layer that does not require further processing prior to doping may be provided. Alternately, for example, a seed layer may also be applied first with the amorphous/poly material on top, or the amorphous/poly material may be applied first, as explained elsewhere herein. Next, an optional step of heating the amorphous/poly material and seed layer (step 330) may then be performed, until the material is transformed into partially or fully crystalline form. Here, for example, this heating step may comprise any of the heating and/or laser application techniques set forth herein.

Next, in some exemplary implementations, dedicated doping steps (steps 340 and 350) may be performed. Here, the N+ and P+ regions may be doped in several ways; further, the N-type doping may be done first or the P-type doping may be done first. In one exemplary implementation, the silicon layer may be coated with dopant paste followed by a laser application on the region where the dopant is to be incorporated (step 340). For example, this could be a paste containing an N-type dopant such as Arsenic, Phosphorous or Antimony. Following the incorporation of the first dopant, the paste is cleaned off and a second paste, e.g., containing a P-type dopant such as Boron may, be coated on the silicon over the regions where the anode structures are desired. Next, a second doping step is performed to dope the selected regions with p-type material (step 350). Here, for example, another heating step may be performed (not shown), via a lamp or laser, to irradiate the regions where the p-type dopant is to be incorporated. Once completed, the associated paste is cleaned off as well.

At this point, the silicon layer has both the N-type and P-type dopants incorporated. In implementations including an insulating layer, an insulating material may now be deposited (step 360). Here, for example, the insulating layer may be $SiO_2$, or SiN or SiON. In an insulating layer is formed, then contact holes must be opened in the insulating layer (step 370). In some implementations, laser ablation may be performed to open the contact holes. Other approaches like photolithography using masks or inkjet printing may also be used.

Contacts are then placed above the doped regions, step 380. If an insulating layer has been deposited, the contacts are typically placed over the insulating layer once the contact holes are open. The contacts may be one or more electrically conductive materials or metals, as set forth below and elsewhere herein, and provided by means of known techniques, such as metallization process(es) suitable for placing metals on silicon substrates. Here, for example, exemplary metallization layers may be provided in several steps. In one exemplary implementation, Nickel (Ni) is deposited and then the substrate is heated to about 200° C. to about 500° C., or to about 300° C. Next, the unreacted Nickel, e.g., on top of the insulating layer, may be stripped away. The Nickel that is in the contact holes will form Nickel silicide which can create very low contact resistance. Al or Ag may then be screen-printed to create the metal lines. Then, one or more anneal processes may then be performed at temperature ranges between about 300° C. and about 650° C. or between about 400° C. and about 450° C., to make the metallization stable. In one exemplary implementation, the anneal may be comprised of 2 steps, one performed at about 200° C. and then a higher temperature anneal at about 450° C. Finally, an optional insulating layer such as SiO2, SiN or SiON or EVA (Ethyl vinyl acetate) may be applied to cover the metallization layer.

According to the innovations of FIG. 3B, the doping may also be performed integral with the metallization. The initial steps (steps 310-370) of FIG. 3B are similar to those of FIG. 3A. Furthermore, with regard to one exemplary implementation consistent with FIG. 3B, a dopant such as Antimony (Sb) may be incorporated into or onto a metallization paste (e.g. Silver paste), wherein both materials are then applied (e.g., screen printed onto) the surface (step 390). Next, a heating cycle is performed (step 395), such as with a lamp system or a laser. This process enables incorporation of the n-type dopant under the metal lines, wherein the metallization and N-type dopant are provided with a single application/process. Further, then, as Aluminum is a p-type dopant by itself, Aluminum lines could be screen printed to provide the complementary process for providing the anode along with the contact above it. Here, with an associated heating step, Aluminum contact lines would be provided and the Silicon under the Aluminum lines would get doped with the Al, wherein p-type regions are then created. Lastly, as an optional process, an initial step of coating the substrate with an anti-reflective coating (step 310) may be performed prior to the placement and heating of the silicon materials on the substrate, as set forth in more detail above in association with FIGS. 5A and 5B.

As such, consistent with the innovations herein (for example, films of reduced thickness, which: (i) may be doped without the need for higher furnace temperatures e.g. via laser irradiation; and/or (ii) are characterized by smaller volumes that do not require higher furnace temperatures to passivate all of the traps throughout a e.g. 150-200 micron silicon wafer, etc.), all furnace steps associated with solar cell device fabrication may be performed at less than about 600° C., or at less than about 500° C. Moreover, in accordance with innovative processes consistent with FIGS. 3A and 3B and/or as set forth elsewhere herein, use of such thin silicon layers (e.g., about 0.5 μm to about 30 μm, etc.) on base substrates without any furnace process above 500-600° C., further allows realization of very low material costs as well as use of low temperature substrates such as glass, plastic, etc., and hence lower manufacturing costs of the solar cells.

Figure 4:
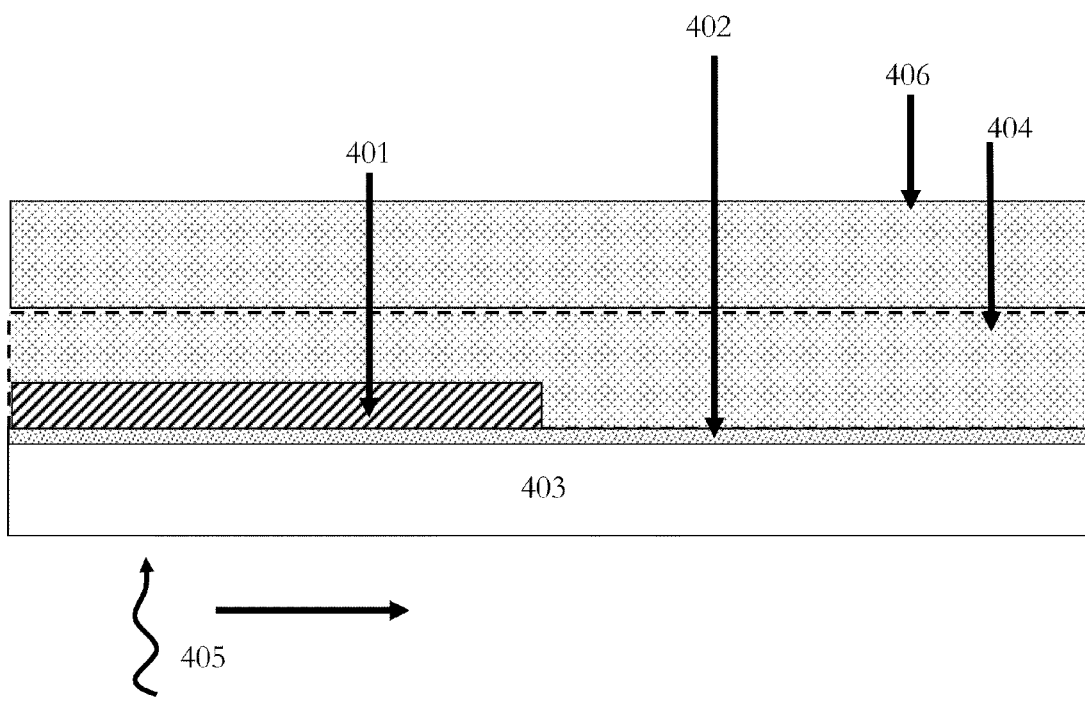
FIG. 4 illustrates a substrate having a seed layer above an amorphous/poly material layer, receiving laser irradiation for crystallization, consistent with aspects related to the innovations herein.

FIG. 4 illustrates a substrate having a seed layer above an amorphous/poly material layer, receiving laser irradiation to crystallize the amorphous/poly layer, consistent with aspects related to the innovations herein. It should be noted that, while use of crystallized silicon (as described here and elsewhere) yields further benefits for certain implementations, it is not necessary for all of the innovative solar cell architectures herein. In FIG. 4, a substrate 403 having a seed layer 401 beneath a first amorphous/poly material layer 404 as well as a layer of second amorphous/poly material 406 on top of the first, and receiving laser irradiation from the bottom 405 to crystallize the amorphous/poly material, is shown. Referring to the exemplary implementation of FIG. 4, the substrate 403 may be coated with an optional anti-reflective layer 402 and an amorphous/poly layer 404 such as a silicon layer or a silicon-containing layer. Further, the seed layer 401 may already be bonded on the anti-reflective layer 402 and crystallized with heat or laser. As further shown in FIG. 4, a second amorphous/poly layer 406, such as a silicon or silicon containing layer, may be deposited on top of the first amorphous/poly layer 404. The second amorphous/poly layer 406 may be amorphous silicon similar to the first amorphous layer 404. In some implementations, the second silicon containing layer 406 may be polysilicon or silicon-germanium (SiGe). In other words, the layer 406 and layer 404 may be the same composition or different compositions. In some exemplary implementations, a laser 405 may be used to crystallize the layer 406, in particular, via the sub-melt laser anneal processes herein. Further, in some implementations, it may be desirable to leave layer 406 partially or fully amorphous (non-crystallized) to take advantage of the better light absorption properties of amorphous silicon. Here, aspects of the innovations herein may relate to the creation of a layer of crystallized silicon on a substrate/glass using a 2-step process. In exemplary implementations, this silicon layer can be between about 0.05 μm and about 25 μm thick. Moreover, such thicknesses are substantially less than the 150 μm thick silicon wafers that are used to make the dominant solar cells in the marketplace.

Figure 5A:
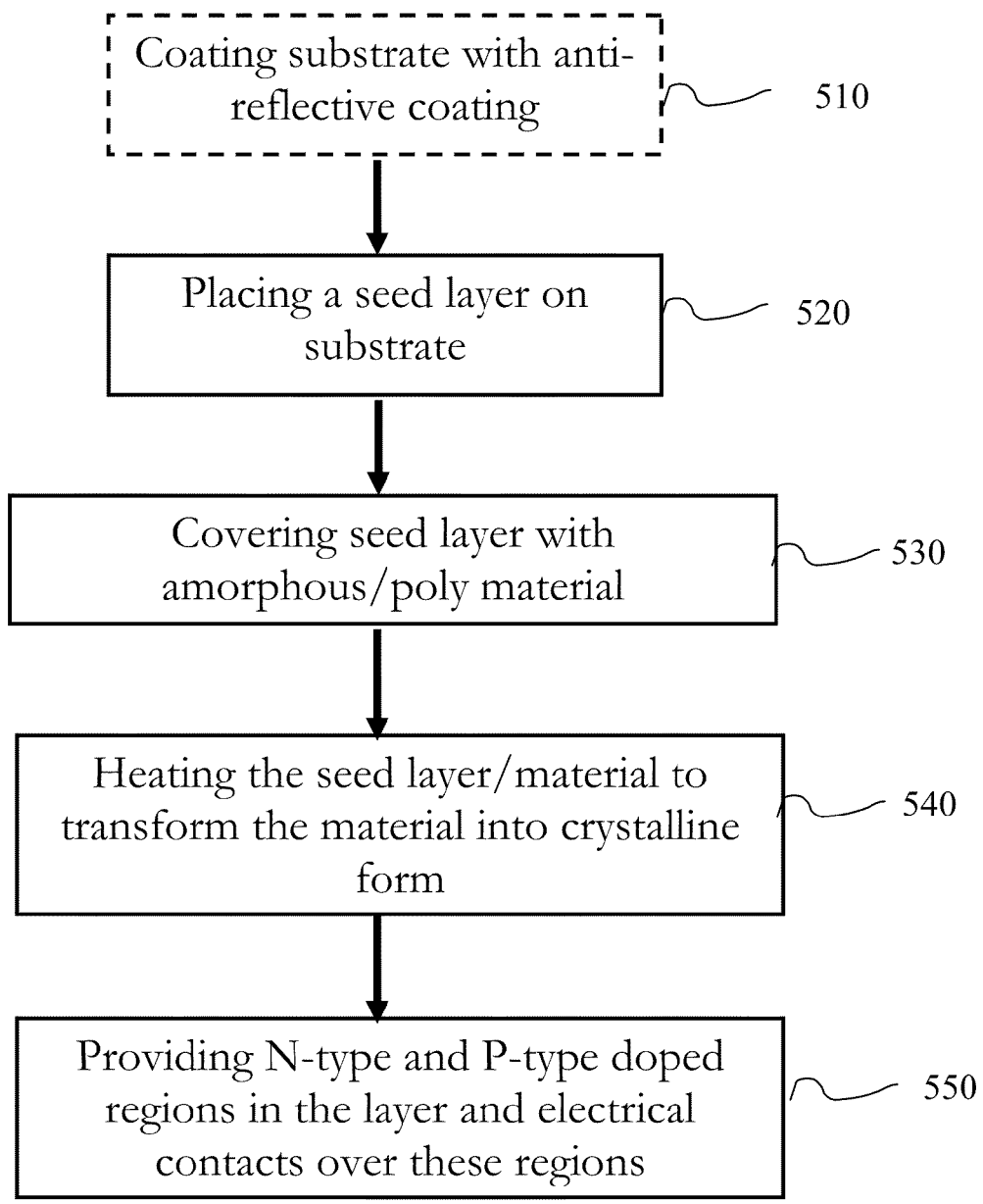
FIGS. 5A and 5B illustrate exemplary methods related to fabrication of thin-film substrates, consistent with aspects related to the innovations herein.
Figure 5B:
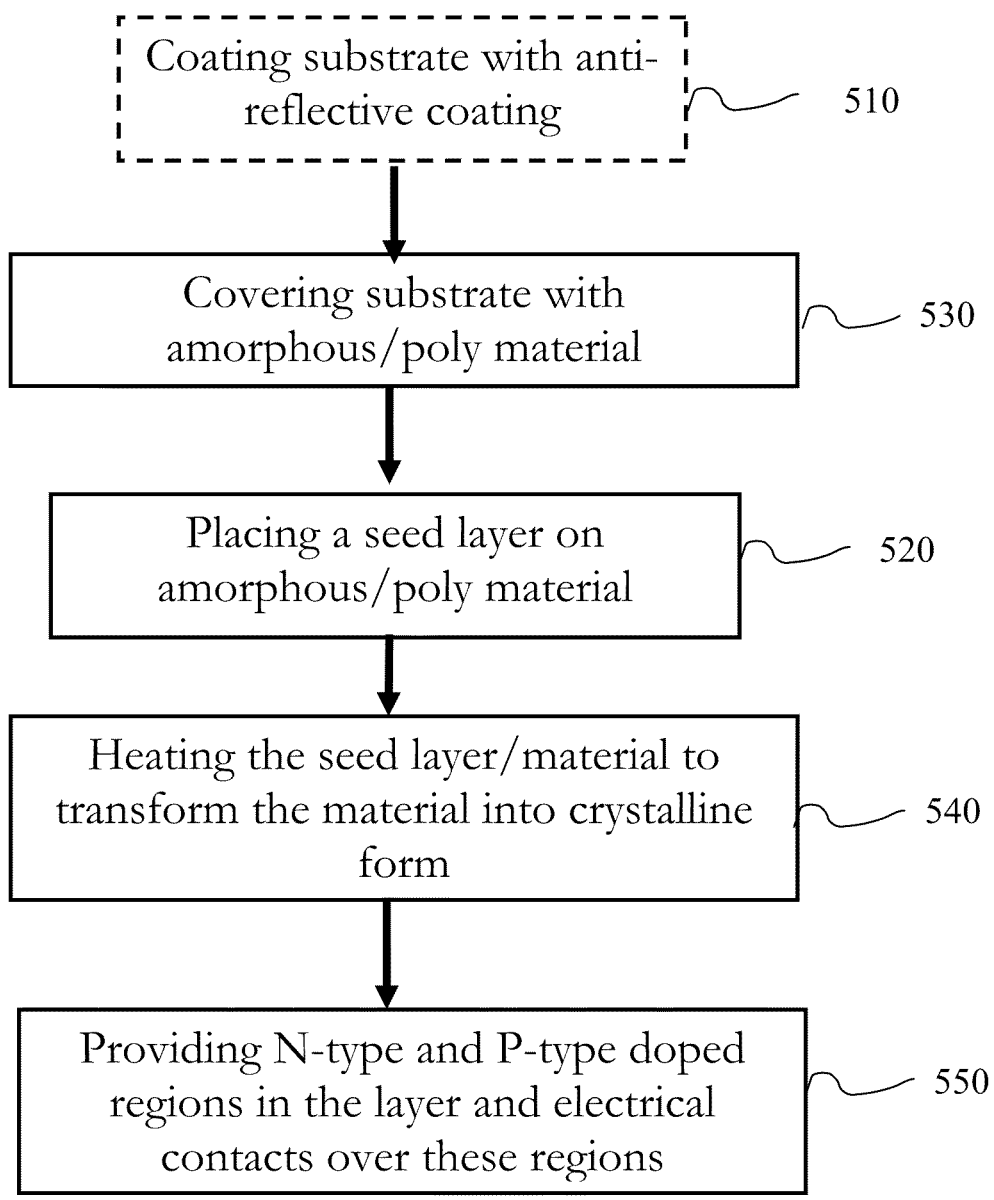

FIGS. 5A and 5B depict exemplary methods related to fabrication of thin-film substrates, consistent with aspects related to the innovations herein. Referring to FIG. 5A, an exemplary method of achieving a backside only contact thin film solar cells is illustrated. As shown in FIG. 5A, a silicon-containing seed layer may be placed on a substrate, such as glass (step 520). This crystalline silicon-containing seed layer may be placed on top of the substrate, or it may be placed on top of another layer such as an anti-reflective coating, as explained in more detail above. Here, the seed layer may also be bonded to the substrate or other layer by means of electrostatic bonding. The seed layer may also be placed by mechanical means, such as vacuum. In other implementations, either hydrophilic or hydrophobic bonding may be used. In some implementations, bonding using a laser or other heat source may be used. In some exemplary implementations, the seed layer may be about 50 nm to about 100 micrometers, in other exemplary implementations about 200 nm to about 600 nm, and in still other exemplary implementation, about 350 or about 355 nm. Next, in step 530, the seed layer may be covered with an amorphous/poly material, such as amorphous/poly silicon or another amorphous/poly silicon-based material. Other amorphous/poly silicon containing materials include SiGe (silicon-germanium) or SiC (silicon carbide) or SiGeC (silicon-germanium-carbide). In some implementations, the silicon containing amorphous/poly material may have intentional incorporation of deuterium or fluorine. In some exemplary implementations, the amorphous/poly material may be deposited via depositions processes such as CVD or PECVD (plasma enhanced chemical vapor deposition), via sputtering processes, or other known processes of depositing such layer(s). Here, for example, an amorphous/poly layer having a thickness of about 20 nm to about 1000 nm may be deposited over the seed layer. In further exemplary implementations, a layer of about 30 nm to about 60 nm may be deposited on the seed layer, and in still further exemplary implementations, a layer of about 45 nm may be deposited. Additionally, in step 540, the seed layer and amorphous/poly material may be heated to transform these materials into crystalline form. Here, for example, these materials may be heated by conventional heating mechanisms used, such as strip heaters or lamps, and/or they may be heated via lasers to crystallize the material, such as via the sub-melt laser anneal processes set forth above or the laser crystallization processes set forth below. In some implementations using lamps, the lamps may be configured in the form of a line source focused on the material. In some exemplary implementations, a laser of wavelength between about 266 nm and about 2 micrometers may be applied to the materials to transform them into crystalline form. In other exemplary implementations, lasers of wavelengths from about 400 nm to about 700 nm may be used, lasers of green wavelength may be used, lasers of ultraviolet wavelength may be used, and/or in still further exemplary implementations, a laser having a wavelength of about 532 nm or about 515 nm may be used. Finally, a step of providing N-type and P-type doped regions in the layer as well as electrical contacts over these regions (step 550) may then be performed, as set forth in more detail above. Here, the doped regions may be created first, with the contacts being provided afterwards via a separate process, or the dopants may be provided on/along with the contacts and infused into the layer via a subsequent heating process. Further, as an optional process, an initial step of coating the substrate with an anti-reflective coating (step 510) may be performed prior to the placement and heating of the silicon materials on the substrate.

In general, the laser anneal processes herein may be optimized to grow the crystal vertically on top of the seed layer, and may also be applied to grow the crystal laterally on the side of the seed layer. According to exemplary implementations of the present innovations, the lasers used herein may utilize different settings such as power, pulse energy, scan speed, and spot size (e.g., on top of the seed layer, etc.), and/or different settings or even different lasers when being irradiated on the sides of the seed layers.

FIG. 5B illustrates an exemplary method of crystallizing silicon/silicon-based materials on a substrate, consistent with aspects of the innovations herein. FIG. 5B illustrates an alternate implementation of the innovations herein involving similar steps of FIG. 5A, although with the order of placing the amorphous/poly material and seed layer on the substrate reversed. In other words, in FIG. 5B, the substrate is first covered, in step 530 with the amorphous/poly material. Then, in step 520, a silicon-containing seed layer or material is placed on top of the amorphous/poly material. The processes and materials used, here, may be similar to those set forth in connection with FIG. 5A above. Then, once the amorphous/poly material and seed layer are in place, these materials are heated (step 540) using techniques consistent with those set forth above in connection with FIG. 5A or elsewhere herein. In some implementations of the techniques shown in FIG. 5A or FIG. 5B, the laser source may be through the glass. In other implementations, the laser source may be directly incident on the material and seed from the top. Finally, a step of providing N-type and P-type doped regions in the layer as well as electrical contacts over these regions (step 550) may then be performed, as set forth in more detail above. Here, the doped regions may be created first, with the contacts being provided afterwards via a separate process, or the dopants may be provided on/along with the contacts and infused into the layer via a subsequent heating process. Further, as an optional process, an initial step of coating the substrate with an anti-reflective coating (step 510) may be performed prior to the placement and heating of the silicon materials on the substrate.

Figure 6:
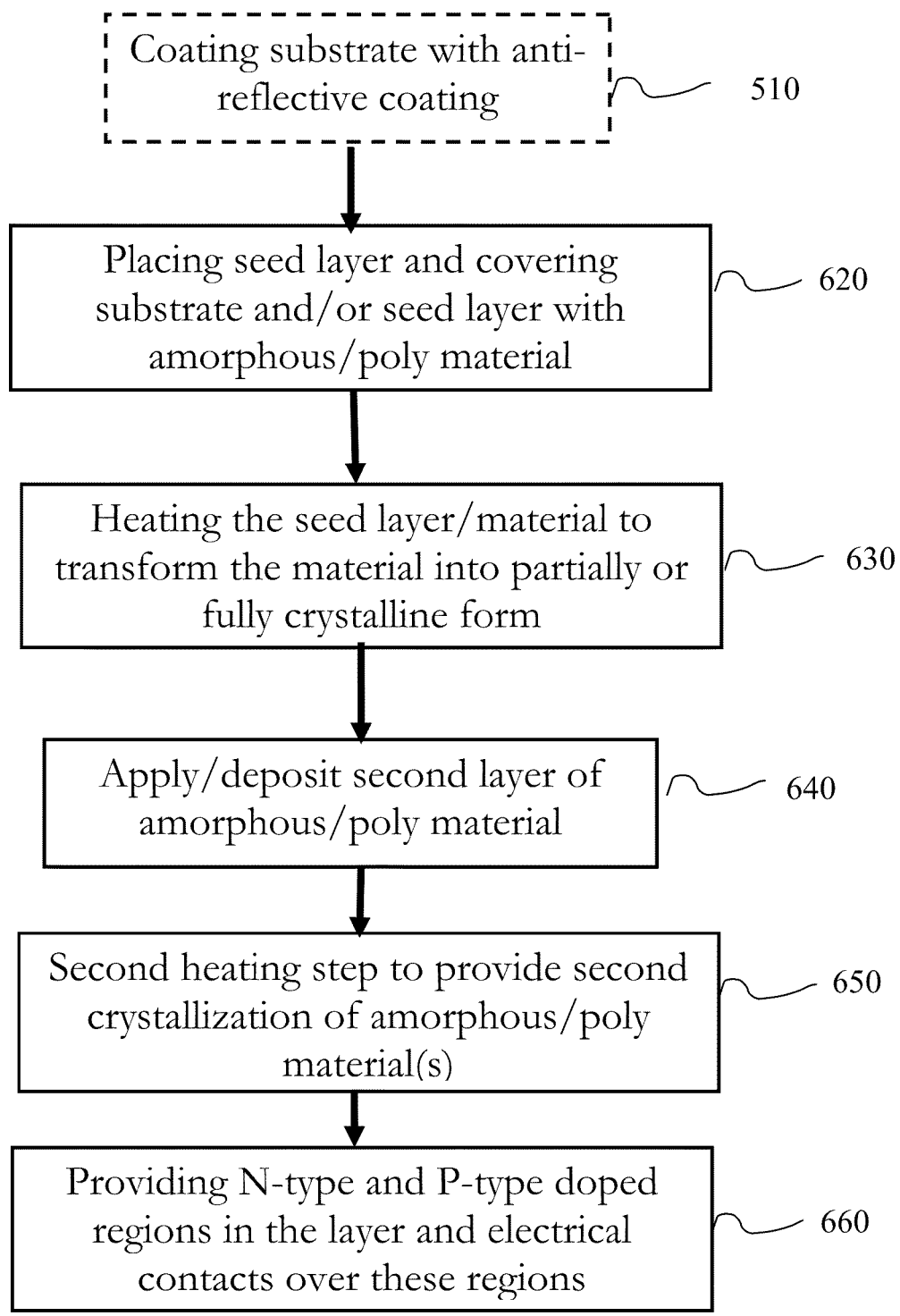
FIG. 6 illustrates another exemplary method related to fabrication of thin-film substrates, consistent with aspects related to the innovations herein.

FIG. 6 illustrates another exemplary method related to fabrication of thin-film substrates, consistent with aspects related to the innovations herein. Referring to FIG. 6, an initial step of applying seed and amorphous/poly layers is performed (step 620). Here, for example, the seed layer may be applied first with the amorphous/poly material on top, or the amorphous/poly material may be applied first as explained elsewhere herein. Next, a step of heating the seed layer and the amorphous/poly material (step 630) is performed, until the material is transformed into partially or fully crystalline form. Here, for example, this heating step may comprise any of the heating and/or laser application techniques set forth herein. Another step of applying a second layer of amorphous/poly material is then performed (step 640). Here, according to one or more exemplary implementations, a second amorphous/poly layer, such as a layer of amorphous silicon, having a thickness of about 50 nm to about 30 μm may be deposited. For example, a second amorphous/poly layer of between about 1 μm to about 8 μm may be deposited. According to some exemplary implementations, a second amorphous/poly layer of about 4 μm may be deposited. Further, prior to deposition of the second amorphous/poly layer, an optional soft etch may be performed. The soft etch may be used to remove any native oxide on top of the first amorphous/poly layer. In addition, the soft etch may be tailored to roughen the surface of the first amorphous/poly layer to improve the adhesion of the second amorphous/poly layer. Next, another step of heating may then be performed (step 650) to achieve further crystallization after deposition of this second amorphous/ploy layer. Again, such crystallization may be achieved via any of the heating and/or laser application processes set forth herein. According to one or more exemplary implementations, here, this material may be heated via a laser having a wavelength between about 266 nm and about 2 μm. Further, in some implementations, the laser may be within or near to the infrared wavelengths, the laser may have a wavelength between about 800 nm and about 1600 nm, have a wavelength of about 880 nm, or have a wavelength of about 1.06 μm. Finally, a step of providing N-type and P-type doped regions in the layer as well as electrical contacts over these regions (step 660) may then be performed, as set forth in more detail above. Here, the doped regions may be created first, with the contacts being provided afterwards via a separate process, or the dopants may be provided on/along with the contacts and infused into the layer via a subsequent heating process. Further, as an optional process, an initial step of coating the substrate with an anti-reflective coating (step 510) may be performed prior to the placement and heating of the silicon materials on the substrate, as set forth in more detail above in association with FIGS. 5A and 5B.

In exemplary implementations of the solar cell architecture and innovations described above, the silicon-containing layer may be crystallized using heating/laser step(s), including sub-melt and other features set forth in the related applications incorporated by reference herein. In addition, the crystallization step(s) may also use a seed layer as described in detail below and in FIGS. 7A through 15B.

Figure 7A:
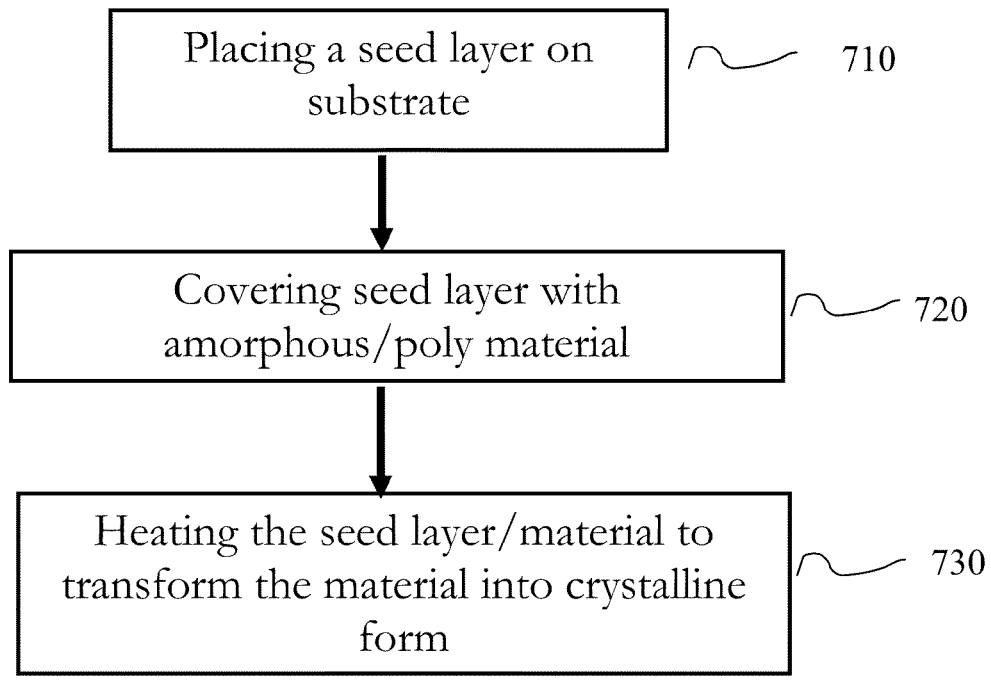
FIGS. 7A and 7B illustrate exemplary methods including crystallization of amorphous/poly materials on substrates, consistent with aspects related to the innovations herein.

FIG. 7A illustrates an exemplary method of crystallizing silicon/silicon-based materials on a substrate, consistent with aspects of the innovations herein. As shown in FIG. 7A, a silicon-containing seed layer may be placed on a substrate, such as glass (step 710). This crystalline silicon-containing seed layer 1 may be placed on top of the substrate, as shown in FIG. 1, or it may be placed on top of another layer such as an anti-reflective coating, as explained in more detail below. Here, the seed layer may also be bonded to the substrate or other layer by means of electrostatic bonding. The seed layer may also be placed by mechanical means, such as vacuum. In other implementations, either hydrophilic or hydrophobic bonding may be used. In some implementations, bonding using a laser or other heat source may be used. In some exemplary implementations, the seed layer may be about 50 nm to about 100 micrometers, in other exemplary implementations about 200 nm to about 600 nm, and in still other exemplary implementation, about 350 or about 355 nm. Next, in step 720, the seed layer may be covered with an amorphous/poly material, such as amorphous/poly silicon or another amorphous/poly silicon-based material. Other amorphous/poly silicon containing materials include SiGe (silicon-germanium) or SiC (silicon carbide) or SiGeC (silicon-germanium-carbide). In some implementations, the silicon containing amorphous/poly material may have intentional incorporation of deuterium or fluorine. In some exemplary implementations, the amorphous/poly material may be deposited via depositions processes such as CVD or PECVD (plasma enhanced chemical vapor deposition), via sputtering processes, or other known processes of depositing such layer(s). Here, for example, an amorphous/poly layer having a thickness of about 20 nm to about 1000 nm may be deposited over the seed layer. In further exemplary implementations, a layer of about 30 nm to about 60 nm may be deposited on the seed layer, and in still further exemplary implementations, a layer of about 45 nm may be deposited. Additionally, in step 730, the seed layer and amorphous/poly material may be heated to transform these materials into crystalline form. Here, for example, these materials may be heated by conventional heating mechanisms used, such as strip heaters or lamps, and/or they may be heated via lasers to crystallize the material, such as via the sub-melt laser anneal processes set forth above or the laser crystallization processes set forth below. In some implementations using lamps, the lamps may be configured in the form of a line source focused on the material. In some exemplary implementations, a laser of wavelength between about 266 nm and about 2 micrometers may be applied to the materials to transform them into crystalline form. In other exemplary implementations, lasers of wavelengths from about 400 nm to about 700 nm may be used, lasers of green wavelength may be used, lasers of ultraviolet wavelength may be used, and/or in still further exemplary implementations, a laser having a wavelength of about 532 nm or about 515 nm may be used.

In general, the laser anneal processes herein may be optimized to grow the crystal vertically on top of the seed layer, and may also be applied to grow the crystal laterally on the side of the seed layer. According to exemplary implementations of the present innovations, the lasers used herein may utilize different settings such as power, pulse energy, scan speed, and spot size (e.g., on top of the seed layer, etc.), and/or different settings or even different lasers when being irradiated on the sides of the seed layers.

Figure 7B:
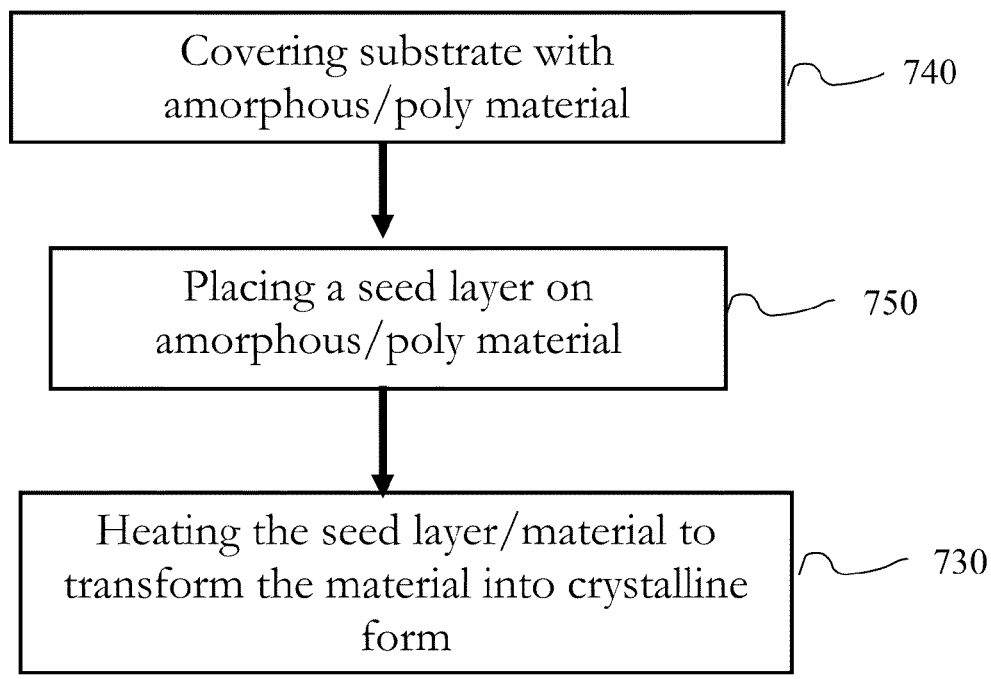

FIG. 7B illustrates an exemplary method of crystallizing silicon/silicon-based materials on a substrate, consistent with aspects of the innovations herein. FIG. 7B illustrates an alternate implementation of the innovations herein involving similar steps of FIG. 7A, although with the order of placing the amorphous/poly material and seed layer on the substrate reversed. In other words, in FIG. 7B, the substrate is first covered, in step 740 with the amorphous/poly material. Then, in step 750, a silicon-containing seed layer or material is placed on top of the amorphous/poly material. The processes and materials used, here, may be similar to those set forth in connection with FIG. 7A above. Lastly, once the amorphous/poly material and seed layer are in place, these materials are heated (step 730) using techniques consistent with those set forth above in connection with FIG. 7A. In some implementations of the techniques shown in FIG. 7A or FIG. 7B, the laser source may be through the glass. In other implementations, the laser source may be directly incident on the material and seed from the top.

Figure 8A:
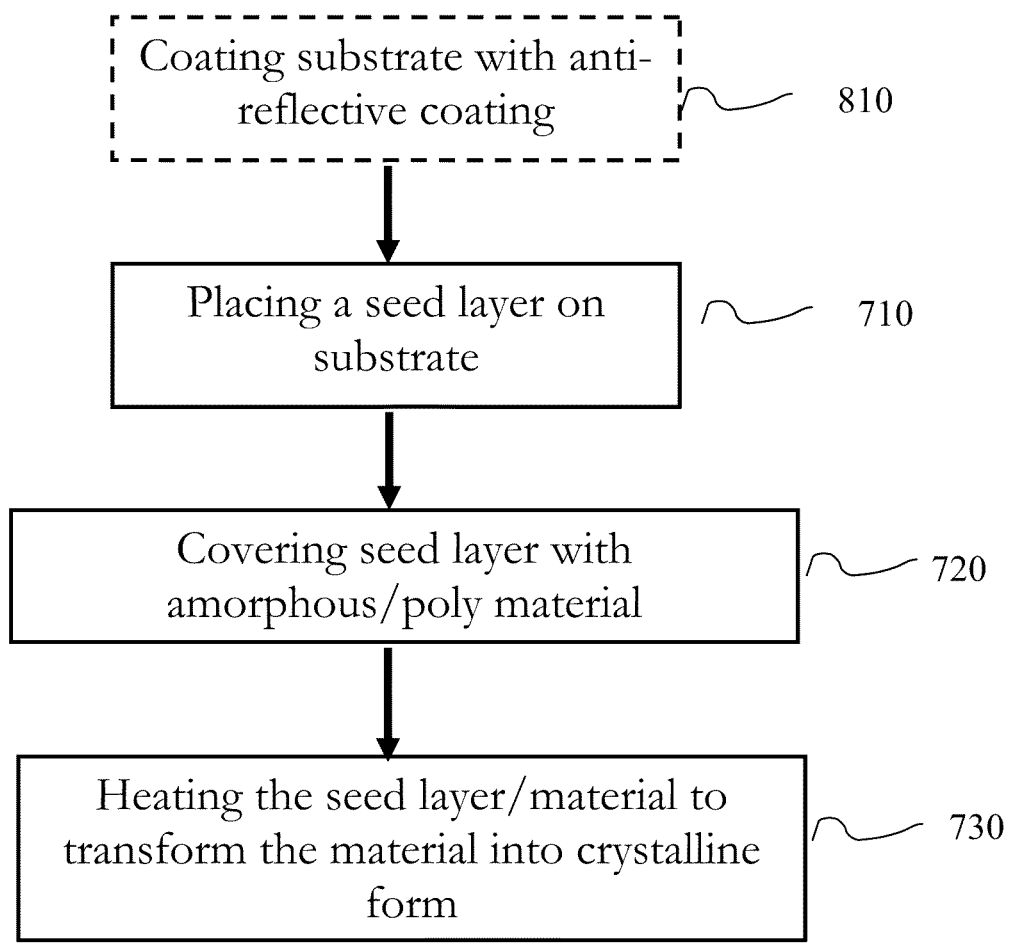
FIGS. 8A and 8B illustrate exemplary methods including crystallization of amorphous/poly materials on substrates including a coating step, consistent with aspects related to the innovations herein.

FIG. 8A illustrates another exemplary implementation of the innovations of FIG. 7A although including a step of initially coating the substrate with an anti-reflective coating (step 810) prior to placement of the seed and amorphous/poly material layers thereon. Here, for example, a silicon based antireflective layer such as SiN, $SiO_2$, SiON, etc., may be first deposited on the substrate, prior to placement and processing of the remaining layers. In some exemplary implementations, a SiN, $SiO_2$ or SiON coating having a thickness of about 50 nm to about 250 nm may be deposited. In other exemplary implementations, such a coating of about 65 nm to about 95 nm in thickness may be used, and in still a further exemplary implementation, a coating of about 75 nm in thickness may be used. The anti-reflective coating layer may also be composed of more than one material, such as, for example a SiN layer applied in connection with an SiO2 layer. According to one exemplary implementation, the SiN layer may be of about 75 nm thick and the SiO2 layer may be about 20 nm thick. Further, a layer of this nature, such as a SiO2 layer, may serve as a stress-relief layer. In alternate implementations, such materials of thickness in a range of about 120 nm to about 180 nm, or of about 150 nm, may be used, such as with SiN layers. Consistent with other aspects of the innovations herein, SiO2 layers having thickness in ranges between about 0 (little or no layer) through about 200 nm, between about 10 nm to about 30 nm, or of about 20 nm may be used. Next, the steps of placing a silicon-containing seed layer on the substrate (710), covering the seed layer with amorphous/poly material (720), and heating the seed layer/material to transform the material into crystalline form (730), as with FIG. 7A, may be performed on top of the anti-reflective coating.

Figure 8B:
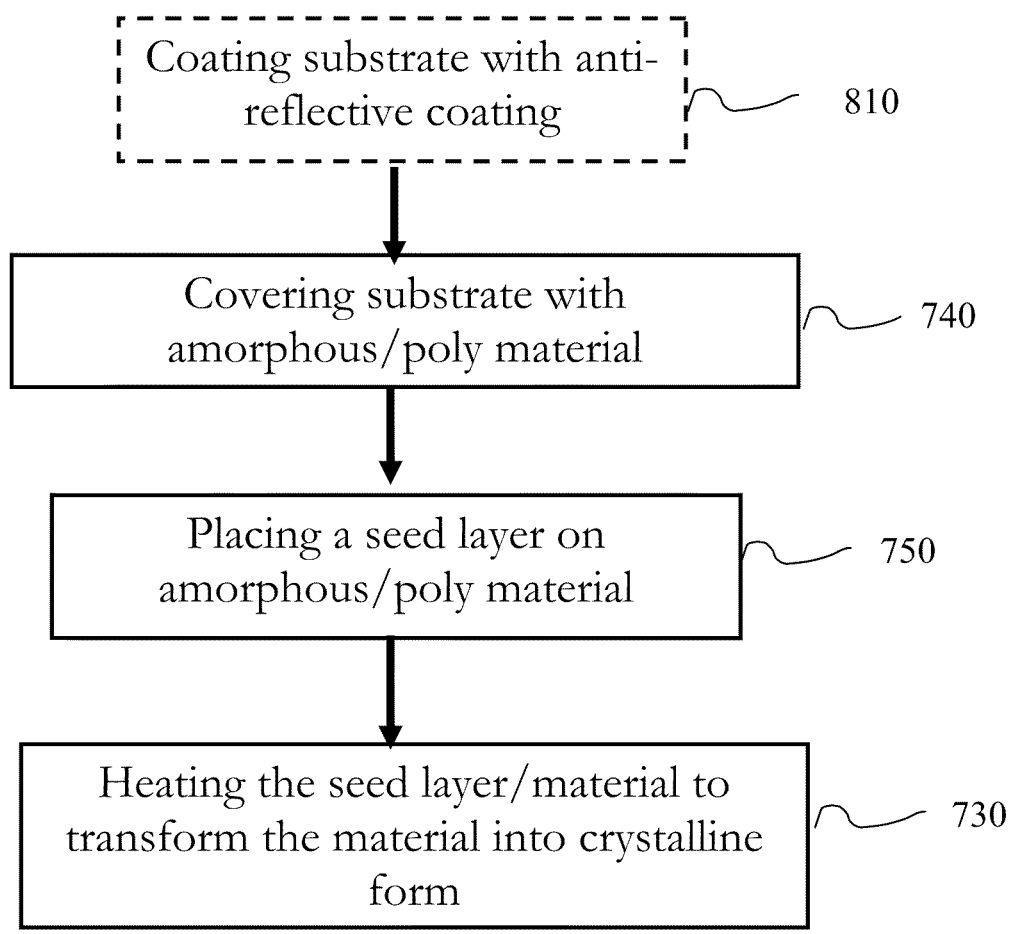

FIG. 8B illustrates another exemplary implementation of the innovations of FIG. 7B although including a step of initially coating the substrate with an anti-reflective coating (step 810) prior to placement of the amorphous/poly material and seed layers thereon. Anti-reflective coatings consistent with those set forth above in connection with FIG. 8A may be used. Further, after the anti-reflective coating is applied, the steps of covering with amorphous/poly material (740), placing a silicon-containing seed layer on the amorphous/poly material (750), and heating the seed layer/material to transform the material into crystalline form (730) may be performed on top of the anti-reflective coating.

Figure 9:
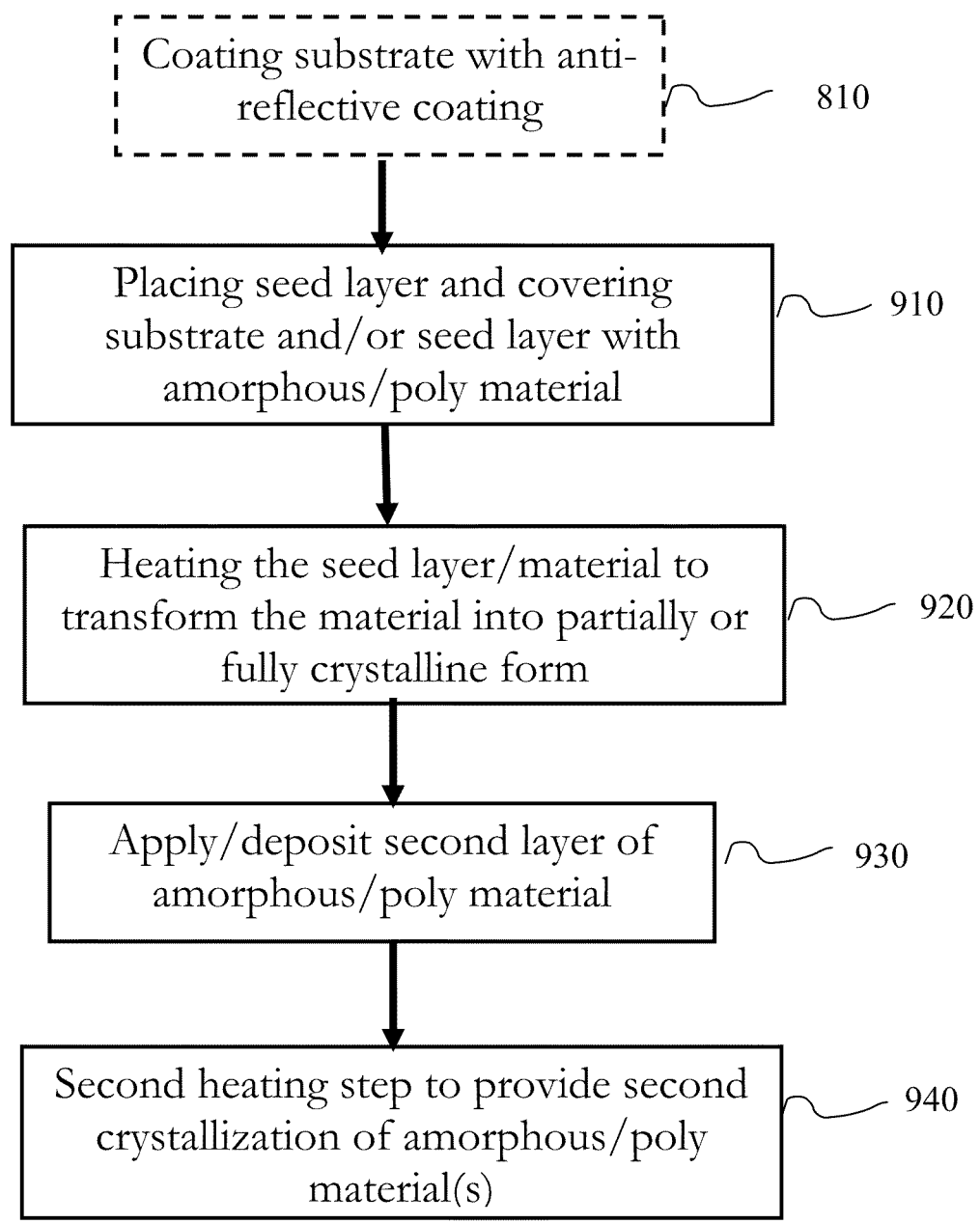
FIG. 9 illustrates another exemplary method including crystallization of amorphous/poly materials on a substrate, consistent with aspects related to the innovations herein.

FIG. 9 illustrates another exemplary method of crystallizing silicon/silicon-based materials on a substrate, consistent with aspects of the innovations herein. Referring to FIG. 9, an initial step of applying seed and amorphous/poly layers is performed (step 910). Here, for example, the seed layer may be applied first with the amorphous/poly material on top as explained in connection with FIG. 7A, or the amorphous/poly material may be applied first as explained in connection with FIG. 7B. Next, a step of heating the seed layer and the amorphous/poly material (step 920) is performed, until the material is transformed into partially or fully crystalline form. Here, for example, this heating step may comprise any of the heating and/or laser application techniques set forth herein. Another step of applying a second layer of amorphous/poly material is then performed (step 930). Here, according to one or more exemplary implementations, a second amorphous/poly layer, such as a layer of amorphous silicon, having a thickness of about 50 nm to about 30 µm may be deposited. For example, a second amorphous/poly layer of between about 1 µm to about 8 µm may be deposited. According to some exemplary implementations, a second amorphous/poly layer of about 4 µm may be deposited. Further, prior to deposition of the second amorphous/poly layer, an optional soft etch may be performed. The soft etch may be used to remove any native oxide on top of the first amorphous/poly layer. In addition, the soft etch may be tailored to roughen the surface of the first amorphous/poly layer to improve the adhesion of the second amorphous/poly layer. Finally, another step of heating may then be performed (step 940) to achieve further crystallization after deposition of this second amorphous/ploy layer. Again, such crystallization may be achieved via any of the heating and/or laser application processes set forth herein. According to one or more exemplary implementations, here, this material may be heated via a laser having a wavelength between about 266 nm and about 2 µm. Further, in some implementations, the laser may be within or near to the infrared wavelengths, the laser may have a wavelength between about 800 nm and about 1600 nm, have a wavelength of about 880 nm, or have a wavelength of about 1.06 µm. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 10:
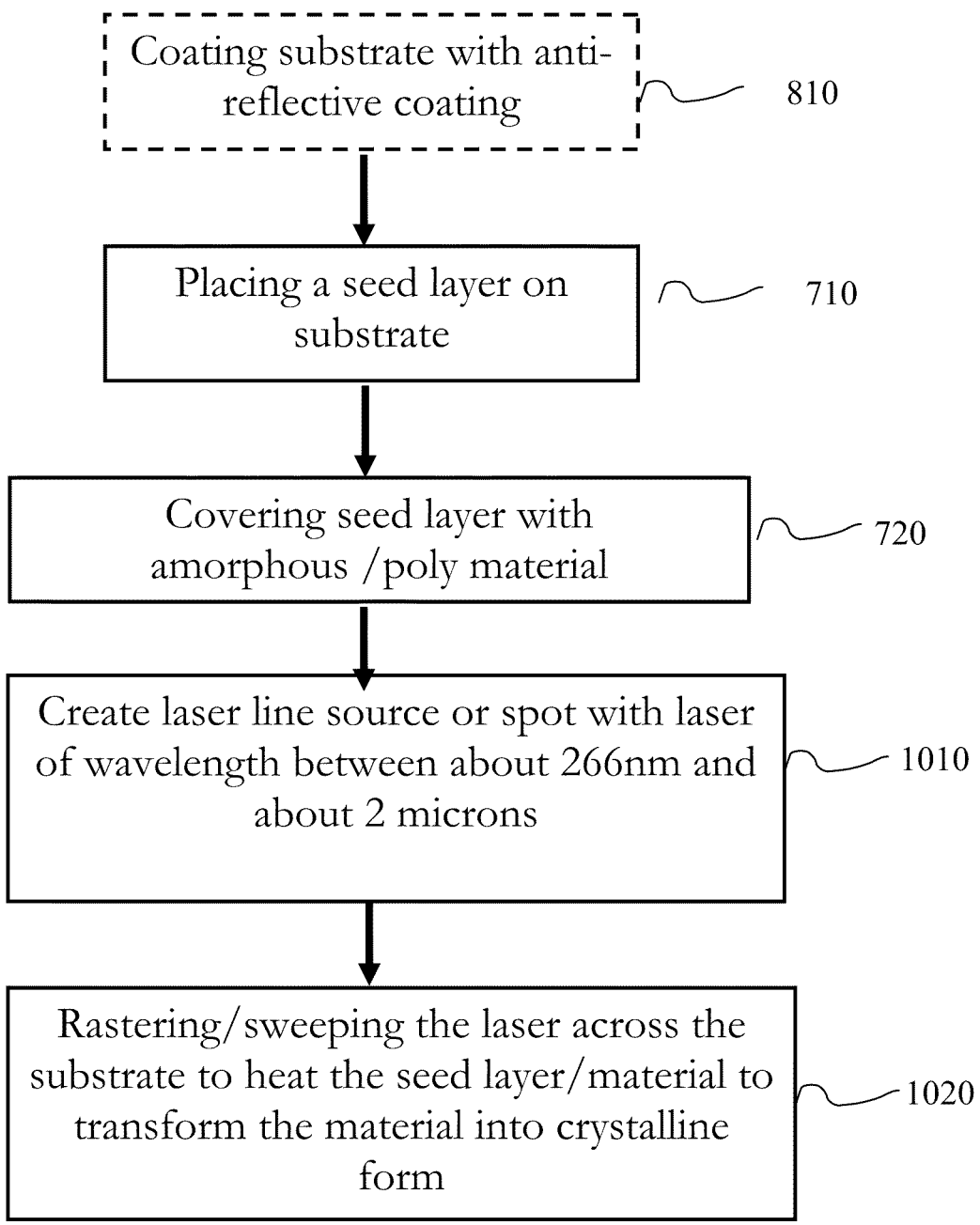
FIGS. 10-14 illustrate further exemplary methods including crystallization of amorphous/poly materials on substrate(s), consistent with aspects related to the innovations herein.

FIG. 10 illustrates a further exemplary method of crystallizing silicon/silicon-based materials on substrate(s), consistent with aspects of the innovations herein. FIG. 10 illustrates an exemplary method of crystallization comprising initial steps (steps 710 and 720) related to placement of materials on a substrate as well as heating steps (steps 1010 and 1020) related to crystallizing the materials upon a substrate. This exemplary method begins with steps of placing a silicon-containing seed layer on substrate 710, and covering the seed layer with amorphous/poly material 720, as set forth in more detail in connection with FIGS. 7A and 7B, above. These steps (steps 710 and 720) may also be done in the reverse order, as explained above in connection with FIGS. 8A and 8B. With regard to the exemplary heating/crystallization steps, here, a step of creating a laser line or spot source with a laser of a wavelength between about 266 nm and about 2 µm (step 1010) may be performed. Here, the laser may be focused on the seed/material from above, or through the substrate (if mostly transparent to the wavelength chosen). Next, one or more steps of rastering and/or sweeping the laser across the substrate (step 1020) are performed. In some exemplary implementations, the laser may first be focused on/over the seed layer and then swept across the substrate to crystallize the deposited material. Here, such rastering or sweeping may be performed in 2 or more steps and/or directions. For example, the laser may be applied using one or more X-direction scans and/or one or more Y-direction scans, whereby the seed layer/amorphous-poly material is heated to transform it into crystalline form. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 11:
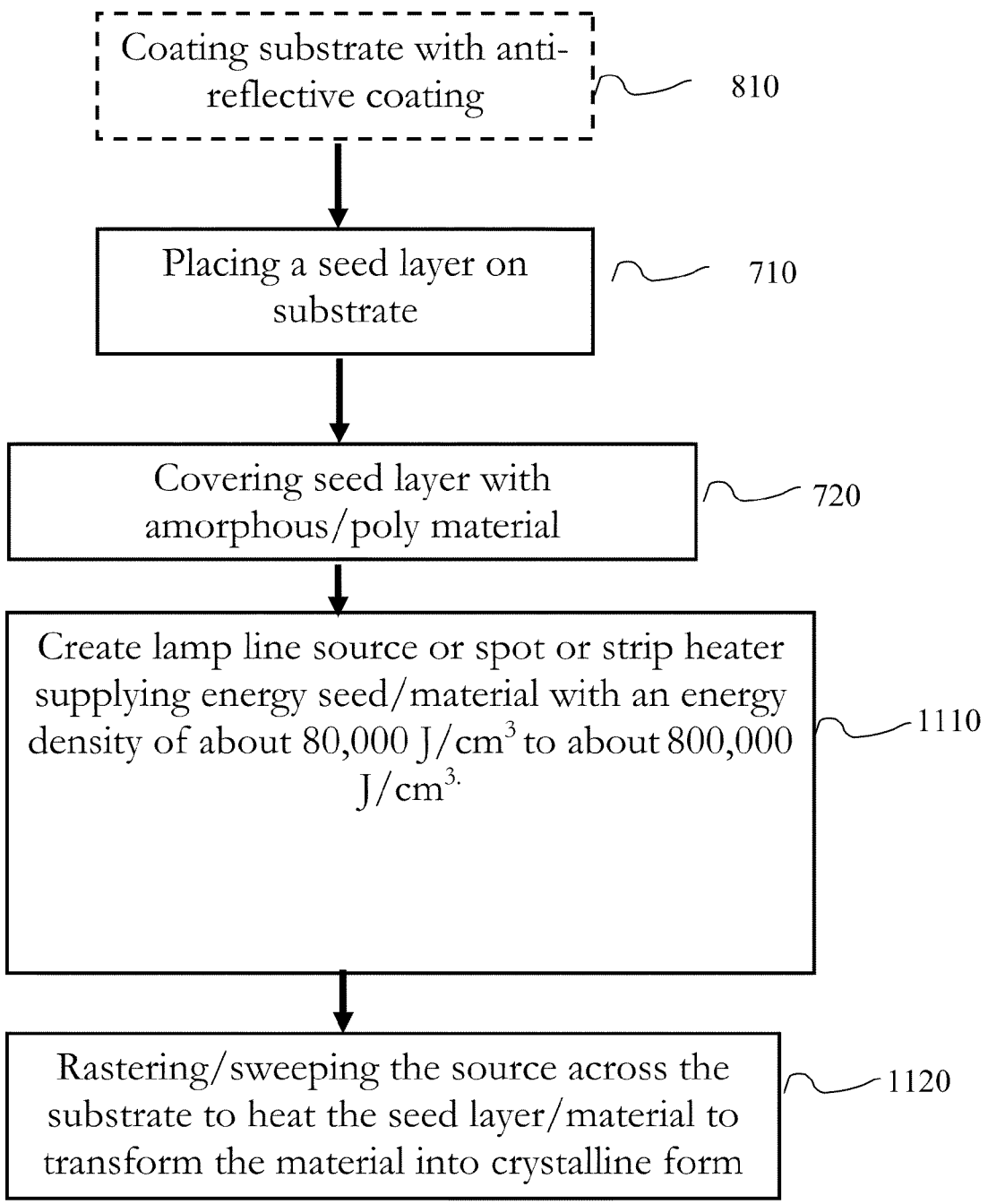

FIG. 11 illustrates yet another exemplary method of crystallizing silicon/silicon-based materials on substrate(s), consistent with aspects of the innovations herein. FIG. 11 illustrates an exemplary method of crystallization comprising initial steps (steps 710 and 720) related to placement of materials on a substrate as well as heating steps (steps 1110 and 1120) related to crystallizing the materials upon a substrate. This exemplary method begins with steps of placing a silicon-containing seed layer on substrate 710, and covering the seed layer with amorphous/poly material 720, as set forth in more detail in connection with FIGS. 7A and 7B, above. These steps (steps 710 and 720) may also be done in the reverse order, as explained above in connection with FIGS. 8A and 8B. With regard to the exemplary heating/crystallization steps, here, a step of applying energy (step 1110) such as heat energy to the seed layer/amorphous-poly material is then performed. Such energy may be applied by a lamp line source, one or more spot heaters, one or more strip heaters, other known heating devices used in semiconductor, thin film or flat panel processing, and/or via any of the laser applications set forth herein. In some exemplary implementations, here, energy such as heat energy having energy densities between about 80,000 J/cm$^3$ to about 800,000 J/cm$^3$, or between about 200,000 J/cm$^3$ to about 550,000 J/cm$^3$, or between about 400,000 J/cm$^3$ to about 450,000 J/cm$^3$ may be applied with regard to silicon layers, here. According to other implementations, energies of specific quantities may be applied as a function of the melting point, composition, physics, and/or thickness of the amorphous/poly material. By way of example, here, for amorphous silicon, energy of between about 400 mJ/cm$^2$ and about 4000 mJ/cm$^2$ for a silicon material thickness of about 50 nm may be applied. Moreover, absent other parameter changes, materials other than such pure silicon will require correspondingly commensurate levels of energy to achieve crystallization as a function of their physics, physical response to the energy being applied, and melting point. According to some exemplary implementations using a lamp or strip heater, the heat source is stepped and repeated, i.e., one area of the amorphous/poly material is heated and then either the heat source or the substrate is moved/stepped so the heat source is applied to the next area, and so on. In this fashion the amorphous/poly material on the entire area of the substrate may be crystallized. Next, for processes in which such energy is being applied via a movable source, one or more steps of rastering and/or sweeping the source across the substrate (step 1120) are performed. In some exemplary implementations, the laser may first be focused on/over the seed layer and then swept across the substrate to crystallize the deposited material. Here, such rastering or sweeping may be performed in 2 or more steps and/or directions. For example, the laser may be applied using one or more X-direction scans and/or one or more Y-direction scans, whereby the seed layer/amorphous-poly material is heated to transform it into crystalline form. Further, as an optional process, an initial step of coating the substrate with an anti-reflective coating (step 810) may be performed prior to the placement and heating of the silicon materials on the substrate, as set forth in more detail above in association with FIGS. 8A and 8B.

Figure 12:
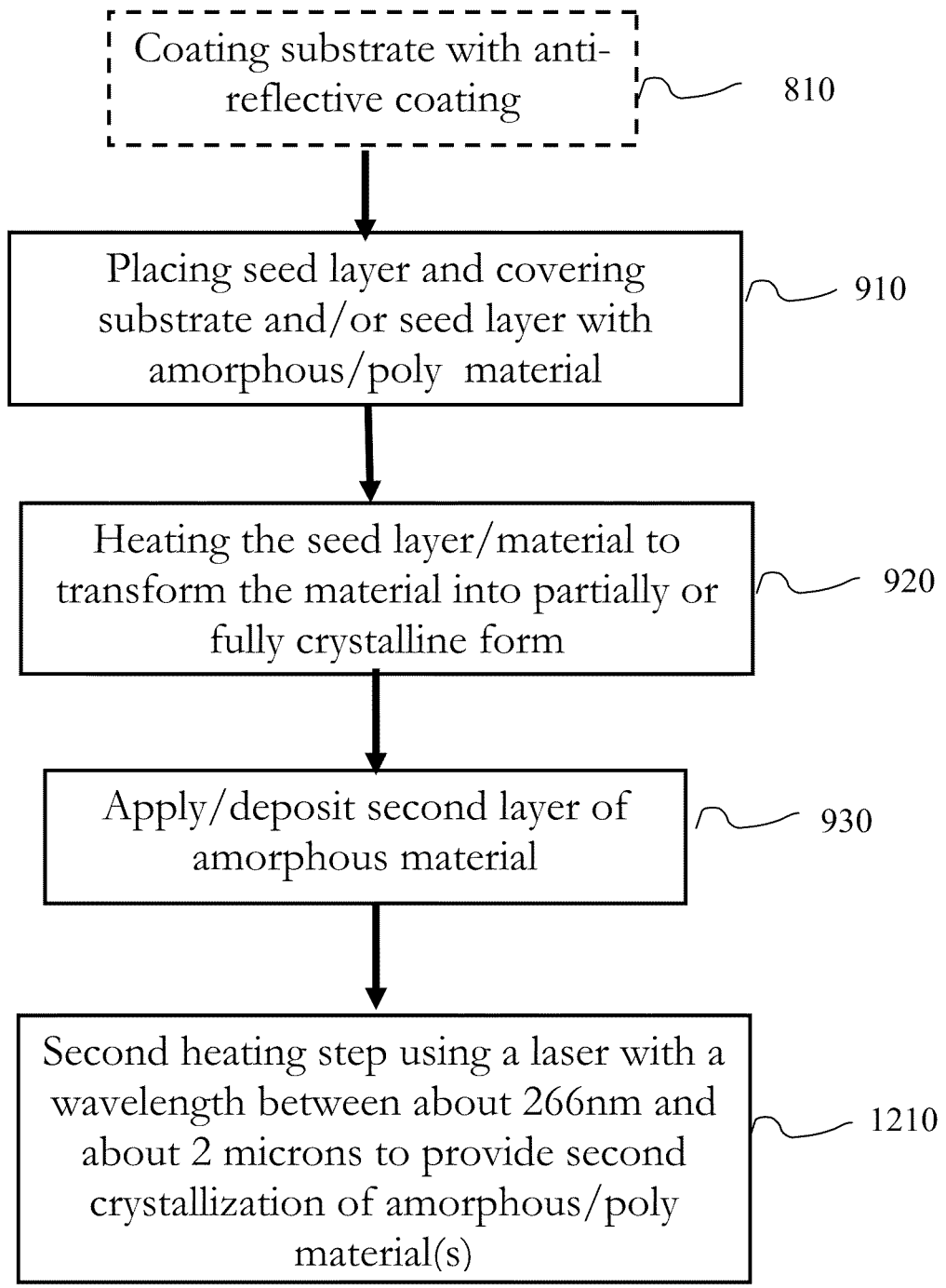

Referring to FIG. 12, another exemplary method of crystallizing amorphous/poly materials on substrate(s), consistent with aspects of the innovations herein, is shown. FIG. 13 illustrates an initial series of steps, steps 910, 920 and 930, consistent with FIG. 9. Specifically, initial steps of placing the seed layer and amorphous/poly material on the substrate 910 (in any order), heating the seed layer/amorphous-poly material 920 into crystalline or partially crystalline form, and covering the crystallized material with a second layer of amorphous/poly material 930 may be performed. Next, in the exemplary implementation illustrated, this second layer of amorphous/poly material may be heated via a laser having a wavelength between about 266 nm and about 2 μm, wherein such lasers may be applied from above the substrate, or from below the substrate (for substrates that are mostly transparent to the wavelength used), with additional details of exemplary application of such lasers are set forth further below. Further, as another optional process, an initial step of coating the substrate with an anti-reflective coating (step 810) may be performed prior to the placement and heating of the silicon materials on the substrate, as set forth in more detail above in association with FIGS. 8A and 8B.

FIG. 13 illustrates still another exemplary method of crystallizing silicon/silicon-based materials on substrate(s), consistent with aspects of the innovations herein. Referring to FIG. 13, an exemplary crystallization process including steps of doping the amorphous/poly material and covering the crystallized material with one or more metallization layers is disclosed. FIG. 13 also illustrates an initial series of steps, steps 910 and 920, consistent with FIG. 9. Specifically, initial steps of placing the seed layer and amorphous/poly material on the substrate 910 (in any order), and heating the seed layer/amorphous-poly material 920 into crystalline or partially crystalline form may be performed. Next, a step of doping the amorphous/poly material 1310 may optionally be performed. Here, for example, N and P dopants may be incorporated into the silicon or silicon-containing material for purpose of fabricating transistor or solar cell structures in such substrates. N and P dopants may be added before (1310A) or after (1310B) the crystallization of the amorphous/poly layer. Further, in certain implementations, addition of one of the dopants may be skipped entirely, such as the P-type dopant (Boron). According to some exemplary implementations, dopants may be added using a dopant paste and application of a laser on the regions where the dopants are to be incorporated. Other methods of dopant incorporation may be used in some implementations, including deposition of doped layers, such as a doped silicon layer. Additionally, an optional step of metallization 1320 may also be performed. In some implementations, for example, a dielectric layer such as silicon dioxide (SiO2) or silicon nitride (SiN) may be added. Here, the thickness of such layers may be between about 20 nm and about 20 μm, preferably about 500 nm (0.5 μm). Further, exemplary metallization layers Aluminum, Silver, other compositions including one or both of these metals, or other metal materials known in the art for use on thin film structures. Lastly, as another optional process, an initial step of coating the substrate with an anti-reflective coating (step 810) may be performed prior to the placement and heating of the silicon materials on the substrate, as set forth in more detail above in association with FIGS. 8A and 8B.

FIG. 14 illustrates yet another exemplary method of crystallizing silicon/silicon-based materials on substrate(s), consistent with aspects of the innovations herein. Referring to FIG. 14, an exemplary process including steps of doping the amorphous/poly material and covering the crystallized material with one or more metallization layers is disclosed. FIG. 14 also illustrates an initial series of steps, steps 910, 920 and 930, consistent with FIG. 9. Specifically, initial steps of placing the seed layer and amorphous/poly material on the substrate 910 (in any order), heating the seed layer/amorphous-poly material into crystalline or partially crystalline form 920, and applying/depositing a second amorphous/poly layer 930, may be performed. However, in FIG. 14, the step of coating/depositing a second layer of amorphous/poly material, step 930, is shown as an optional step because, in some implementations of the innovations herein, the later doping and/or metallization processes are performed in fabricating devices that have only a single layer of amorphous/poly material. Further, one or more doping steps (steps 1410A and 1410B) may also be optionally performed. Again, N and P dopants may be incorporated into the silicon or silicon-containing material for purpose of fabricating transistor or solar cell structures in such substrates. Methods including application/deposition of a second amorphous/poly layer may also include a second heating step, 1310, as set forth herein. Here, then, N and/or P dopants may be added before this heating/crystallization, step 1410A, or such dopants may be added after the heating step, to the crystallized material, step 1410B. Further, in certain implementations, addition of one of the dopants may be skipped entirely, such as the P-type dopant (Boron). And again, dopants in some implementations may be added using a dopant paste and application of a laser on the regions where the dopants are to be incorporated. Furthermore, an optional step of metallization 1320 may also be performed. In some implementations, for example, a dielectric layer such as silicon dioxide (SiO2) or silicon nitride (SiN) may be added. Here, the thickness of such layers may be between about 20 nm and about 20 μm, preferably about 500 nm (0.5 μm). Further, exemplary metallization layers Aluminum, Silver, other compositions including one or both of these metals, or other metal materials known in the art for use on thin film structures. Lastly, as another optional process, an initial step of coating the substrate with an anti-reflective coating (step 810) may be performed prior to the placement and heating of the silicon materials on the substrate, as set forth in more detail above in association with FIGS. 8A and 8B.

Figure 15A:
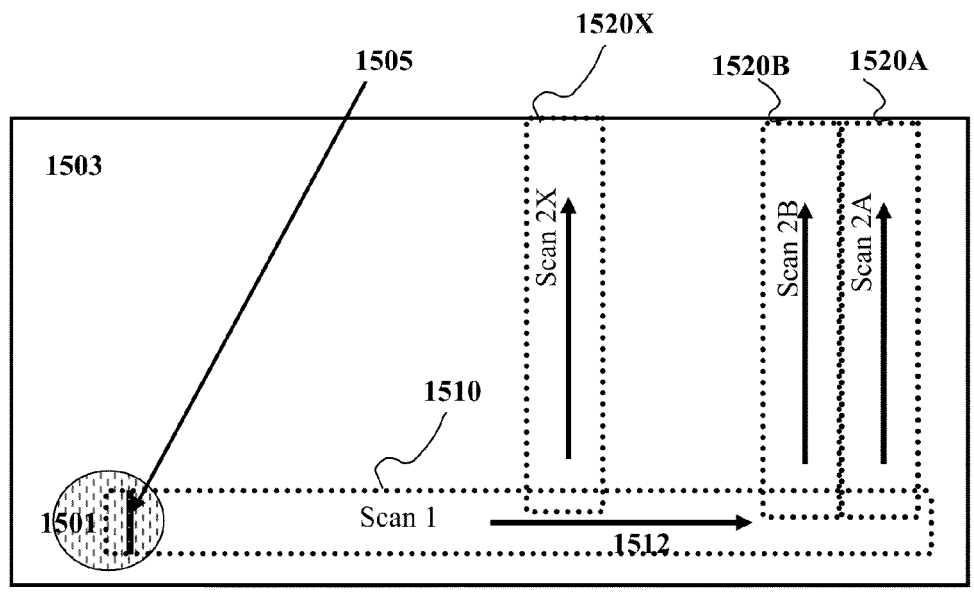
FIGS. 15A and 15B illustrate exemplary methods of rastering or scanning a laser over a substrate, consistent with aspects related to the innovations herein.
Figure 15B:
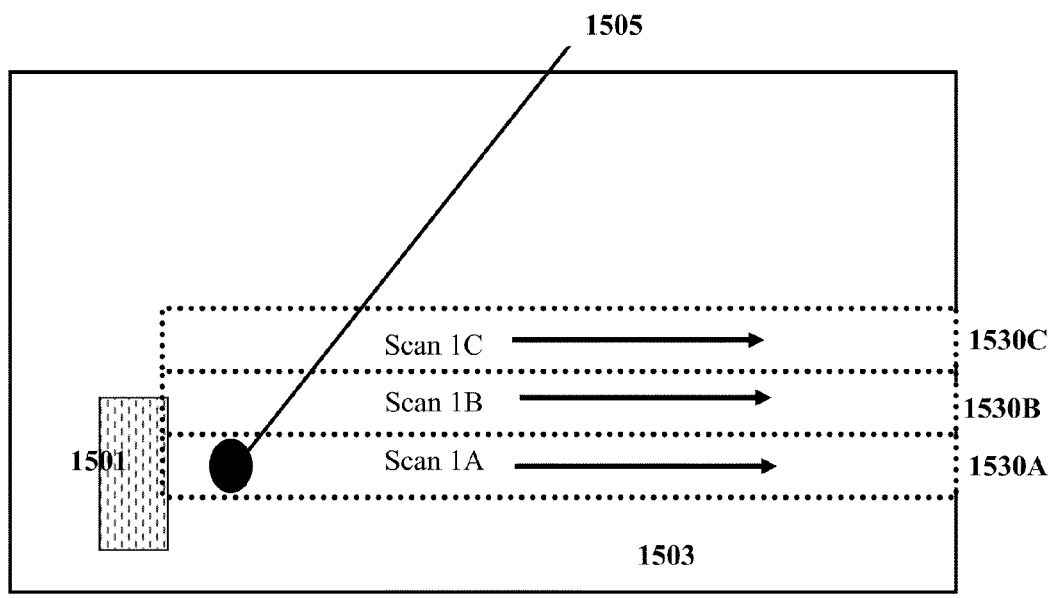

Referring to FIGS. 15A and 15B, exemplary methods of rastering or scanning of lasers over substrates, consistent with aspects of the innovations herein, are shown. FIGS. 15A and 15B are top view diagrams illustrating a base material 1503 to be crystallized (e.g., glass, etc.), a seed layer 1501, and a laser source 1505, which is shown as a line source though could also be, e.g., a spot source. Here, although depicted in one shape, the seed regions may be square, rectangular, circular, or other known shapes used for such seed region. Additionally, exemplary lasers/line sources used consistent with the innovations herein may include, with regard to the long axis, lasers with lines sources of between about 10 mm to about 500 mm, of between about 20 mm to about 80 mm, of about 80 mm, or of about 20 mm. Further, such line sources along the long axis may be 'flat top' sources where the intensity is constant along the long axis. With regard to the short axis, lasers with line sources between about 3 µm and about 100 µm, between about 5 µm and about 50 µm, of about 5 µm, or of about 20 µm. Further, along the short axis, the line sources used may be of standard Gaussian profiles (i.e., the intensity is not flat) although flat profiles may also be used.

Turning to the crystallization techniques shown in FIG. 15A, a first scan 1510 may be performed to crystallize a first zone 1512 along the length of the glass. Next, a series of subsequent scans (1520A, 1520B . . . 1520x) may be performed to propagate crystal over the entire glass sheet. Here, the quantity of scans needed may vary as a function of length of the laser line source. For example, with regard to a 1.3 m (1300 mm) substrate, given a line source of 20 mm, one must perform at least 65 scans to cover the entire glass.

Referring to the crystallization technique shown in FIG. 15B, a process for crystallizing amorphous/poly materials is disclosed. Here, for example, this technique is well suited for subsequent layers of amorphous/poly material, e.g., when an underlying (first) layer has already been crystallized or partially crystallized. (In such instances, it is not necessary to start the rastering or scanning at/over the seed layer, although this may certainly be done in some implementations.) According to one exemplary implementation, the laser source 1505 may be a spot source with a spot size of between about 10 µm to about 750 µm in diameter, or between about 200 µm and about 300 µm, or of about 250 µm. Finally, if the underlying layer has been adequately crystallized, the laser spot may simply be rastered across the whole substrate.

Turning back to overall aspects of the disclosure, advantages of aspects of the current inventions may include innovations consistent with crystallizing amorphous or poly-crystalline materials, such as silicon or silicon containing materials, using a seed layer. Further, aspects of the present disclosure include innovations consistent with use of a silicon crystal as a seed layer to crystallize a base layer (e.g., amorphous/poly silicon, SiGe, SiC, etc.) on substrates, including glass. Further, systems, method and products consistent with the innovations herein may provide uniform grains, high carrier lifetime, and/or improved diffusion length, mobility, etc. In particular, as a result of the heating (e.g., laser irradiation, etc.) and use of seed layers herein, crystallized amorphous/poly layers consistent with the innovation herein have a grain size of greater than or equal to 10 microns.

With regard to some specific applications, such as solar cell applications in particular, use of the innovations herein with SiGe (silicon-germanium) increases the light absorption in the infrared region and therefore increases the efficiency of solar cells. In one exemplary implementation, a silicon-germanium layer with about 2 to about 5% germanium is used for the solar cell. Here, a silicon-germanium layer on top of a substrate such as glass may be crystallized as described above.

According to further aspects of the innovations herein, plastic or stainless steel base material is used as the substrate 1. For example, the use of plastic substrates along with these innovations enables low cost flexible solar cells which can be integrated more easily with, e.g., buildings. One exemplary use of plastic substrates with the innovations herein includes integrating solar cells with windows of commercial buildings (also known as BIPV or Building-integrated-photovoltaics).

It is to be understood that the foregoing description is intended to illustrate and not to limit the scope of the inventions herein, which are defined by the scope of the claims. Other implementations are within the scope of the claims.

The invention claimed is:

1. A thin film photovoltaic device comprising:
   a non-semiconductor substrate comprising glass, plastic and/or metal; and
   a layer of silicon or silicon-containing material positioned on a first side of the substrate, wherein the layer comprises an n-doped region and a p-doped region;
   wherein the n-doped region and the p-doped region are formed on the backside surface of the layer, the backside surface being on a side of the layer that is opposite to the substrate, the n-doped region and the p-doped region being spaced away from the substrate by an undoped portion of the layer such that the n-doped region and the p-doped region are not in direct contact with the substrate, to create an electrical structure characterized by a P-type anode and an N-type cathode forming junction(s) positioned along the backside surface of the layer; and
   wherein the layer of silicon or silicon-containing material is between about 3 micron and about 6 microns in thickness.

2. The device of claim 1 further comprising:
   a first contact placed on the layer above and electrically connected to the n-doped region;
   a second contact place on the layer above and electrically connected to the p-doped region.

3. The device of claim 2 further comprising an insulating layer positioned between the layer and the first and second contacts.

4. The device of claim 3 wherein the n-doped region is electrically connected to the first contact by holes or slots through the insulating layer and p-doped region is electrically connected to the second contact by holes or slots through the insulating layer.

5. The device of claim 1 wherein the P-type anode and the N-type cathode form diodes positioned laterally along the backside surface of the layer.

6. The device of claim 1 wherein the layer is an amorphous/poly layer on the substrate, at least partially crystallized such that average grain size of the crystallized portion is between about 1 micron and about 100 microns.

7. The device of claim 6 wherein the amorphous/poly material has:
   a thickness of a first-deposited layer/portion of between about 40 nm to about to about 500 nm.

8. The device of claim 6 wherein the amorphous/poly material is deposited via a CVD deposition processes, or a PECVD process, or via sputtering.

9. The device of claim 6 further comprising a second amorphous/poly layer connected to the amorphous/poly layer;
   wherein the second amorphous/poly layer is at least partially crystallized via use of a laser heating process which transforms a portion the amorphous/poly material into crystalline form.

10. The device of claim 9 further comprising a seed layer:
    between the amorphous/poly layer and the second amorphous layer; or
    between the amorphous/poly layer and the substrate, or
    between the amorphous/poly layer and an anti-reflective coating on the substrate.

11. The device of claim 10 wherein the laser heating process heats the second amorphous/poly material by heating the seed layer which is in contact with the second amorphous/poly material.

12. The thin film device of claim 6 wherein average grain size of the crystallized portion of the amorphous/poly layer is greater than or equal to 10 microns.

13. The device of claim 8 wherein average grain size of the crystallized portion of the amorphous/poly layer is greater than or equal to 10 microns.

14. The thin film device of claim 6 further comprising:
    a first contact placed on the layer above and electrically connected to the n-doped region;
    a second contact place on the layer above and electrically connected to the p-doped region.

15. The device of claim 14 further comprising an insulating layer positioned between the layer and the first and second contacts.

16. The device of claim 15 wherein the n-doped region is electrically connected to the first contact by holes or slots through the insulating layer and p-doped region is electrically connected to the second contact by holes or slots through the insulating layer.

17. The device of claim 16 wherein average grain size of the crystallized portion of the amorphous/poly layer is greater than or equal to 10 microns.

18. The device of claim 6 wherein the P-type anode and the N-type cathode form diodes positioned laterally along the backside surface of the layer.

19. The device of claim 18 wherein average grain size of the crystallized portion of the amorphous/poly layer is greater than or equal to 10 microns.

* * * * *